US012027207B2

United States Patent
Zhao et al.

(10) Patent No.: US 12,027,207 B2
(45) Date of Patent: Jul. 2, 2024

(54) VERTICAL MEMORY DEVICES AND METHODS FOR OPERATING THE SAME

(71) Applicant: Yangtze Memory Technologies Co., Ltd., Hubei (CN)

(72) Inventors: DongXue Zhao, Hubei (CN); Tao Yang, Hubei (CN); Yuancheng Yang, Hubei (CN); Lei Liu, Hubei (CN); Di Wang, Hubei (CN); Kun Zhang, Hubei (CN); Wenxi Zhou, Hubei (CN); Zhiliang Xia, Hubei (CN); ZongLiang Huo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 146 days.

(21) Appl. No.: 17/646,549

(22) Filed: Dec. 30, 2021

(65) Prior Publication Data
US 2023/0142290 A1    May 11, 2023

Related U.S. Application Data

(63) Continuation of application No. PCT/CN2021/129782, filed on Nov. 10, 2021.

(51) Int. Cl.
*G11C 16/04* (2006.01)
*G11C 16/08* (2006.01)
(Continued)

(52) U.S. Cl.
CPC .......... *G11C 16/0433* (2013.01); *G11C 16/08* (2013.01); *G11C 16/24* (2013.01); *G11C 16/26* (2013.01); *G11C 16/30* (2013.01)

(58) Field of Classification Search
CPC ..... G11C 16/0433; G11C 16/08; G11C 16/24; G11C 16/26; G11C 16/30
(Continued)

(56) References Cited

U.S. PATENT DOCUMENTS 10,991,438 B1    4/2021 Song et al.
2008/0112226 A1*  5/2008 Mokhlesi ........... G11C 16/0483
                                                 257/E27.103
(Continued)

FOREIGN PATENT DOCUMENTS

| CN | 110993009 A | 4/2020 |
| CN | 111095420 A | 5/2020 |
| CN | 111370046 A | 7/2020 |

OTHER PUBLICATIONS

International Search Report of the International Searching Authority directed to related International Patent Application No. PCT/CN2021/129782, dated Aug. 11, 2022; 4 pages.

*Primary Examiner* — Huan Hoang
(74) *Attorney, Agent, or Firm* — Sterne, Kessler, Goldstein & Fox P.L.L.C.

(57) ABSTRACT

This disclosure is directed to methods for performing operations on a memory device. The memory device can include a bottom select gate, a plate line above the bottom select gate, a word line above the plate line, a pillar extending through the bottom select gate, the plate line, and the word line, a source line under the pillar, a drain cap above the pillar and a bit line formed above the drain cap. The method can include applying a first positive voltage bias to the bottom select gate and applying a second positive voltage bias to the word line. The method can also include applying a third positive voltage bias to the bit line after the word line reaches the second positive voltage bias. The method can further include applying a ground voltage to the word line and applying the ground voltage to the bit line.

10 Claims, 17 Drawing Sheets

(51) Int. Cl.
  *G11C 16/24*    (2006.01)
  *G11C 16/26*    (2006.01)
  *G11C 16/30*    (2006.01)
(58) Field of Classification Search
  USPC .................................................. 365/185.05
  See application file for complete search history.

(56) References Cited

U.S. PATENT DOCUMENTS

| | | |
|---|---|---|
| 2016/0204117 A1 | 7/2016 | Liu et al. |
| 2020/0185408 A1 | 6/2020 | Song et al. |
| 2021/0225872 A1 | 7/2021 | Sun et al. |
| 2022/0093151 A1* | 3/2022 | Suzuki .................. H10B 51/20 |

* cited by examiner

VERTICAL MEMORY DEVICES AND METHODS FOR OPERATING THE SAME

CROSS-REFERENCE TO RELATED APPLICATIONS

This application claims priority to PCT Patent Application No. PCT/CN2021/129782, filed on Nov. 10, 2021, which is incorporated herein by reference in its entirety.

TECHNICAL FIELD

This present disclosure generally relates to the field of semiconductor technology, and more particularly, to a method for forming and operating a vertical memory device.

BACKGROUND

Planar memory cells are scaled to smaller sizes by improving process technology, circuit designs, programming algorithms, and fabrication processes. However, as feature sizes of the memory cells approach a lower limit, planar processes and fabrication techniques become challenging and costly. A vertical memory architecture can address the density limitation in planar memory cells.

BRIEF SUMMARY

Embodiments of a vertical memory structure and methods for forming the same are described in the present disclosure.

In some embodiments, a method can include performing a programming operation on a memory device. The memory device can include a bottom select gate, a plate line above the bottom select gate, a word line above the plate line, a pillar extending through the bottom select gate, the plate line, and the word line, a source line under the pillar, a drain cap above the pillar and a bit line formed above the drain cap. The method can include applying a first positive voltage bias to the bottom select gate and applying a second positive voltage bias to the word line. The method can also include applying a third positive voltage bias to the bit line after the word line reaches the second positive voltage bias. The method can further include applying a ground voltage to the word line and applying the ground voltage to the bit line.

In some embodiments, a method can include performing an erasing operation on a memory device. The memory device can include a bottom select gate, a plate line above the bottom select gate, a word line above the plate line, a pillar extending through the bottom select gate, the plate line, and the word line, a source line under the pillar, a drain cap above the pillar and a bit line formed above the drain cap. The method can include applying a first positive voltage bias to the bottom select gate and applying a second positive voltage bias to the plate line. The method can also include reducing the first positive voltage bias to the bottom select gate and applying a negative voltage bias to the source line.

In some embodiments, a method can include performing a programming operation on a memory device. The memory device can include a plate line, a bias gate above the plate line, a word line above the plate line, a pillar extending through the plate line, the bias gate, and the word line, a source line under the pillar, a drain cap above the pillar and a bit line formed above the drain cap. The method can include applying a first positive voltage bias to the bias gate and applying a second positive voltage bias to the word line. The method can also include applying a third positive voltage bias to the bit line after the word line reaches the second positive voltage bias. The method can further include applying a ground voltage to the word line and applying the ground voltage to the bit line.

In some embodiments, a method can include performing an erasing operation on a memory device. The memory device can include a plate line, a bias gate above the plate line, a word line above the plate line, a pillar extending through the plate line, the bias gate, and the word line, a source line under the pillar, a drain cap above the pillar and a bit line formed above the drain cap. The method can include applying a first positive voltage bias to the bias gate and applying a second positive voltage bias to the plate line. The method can also include reducing the first positive voltage bias to the bias gate and applying a negative voltage bias to the source line.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
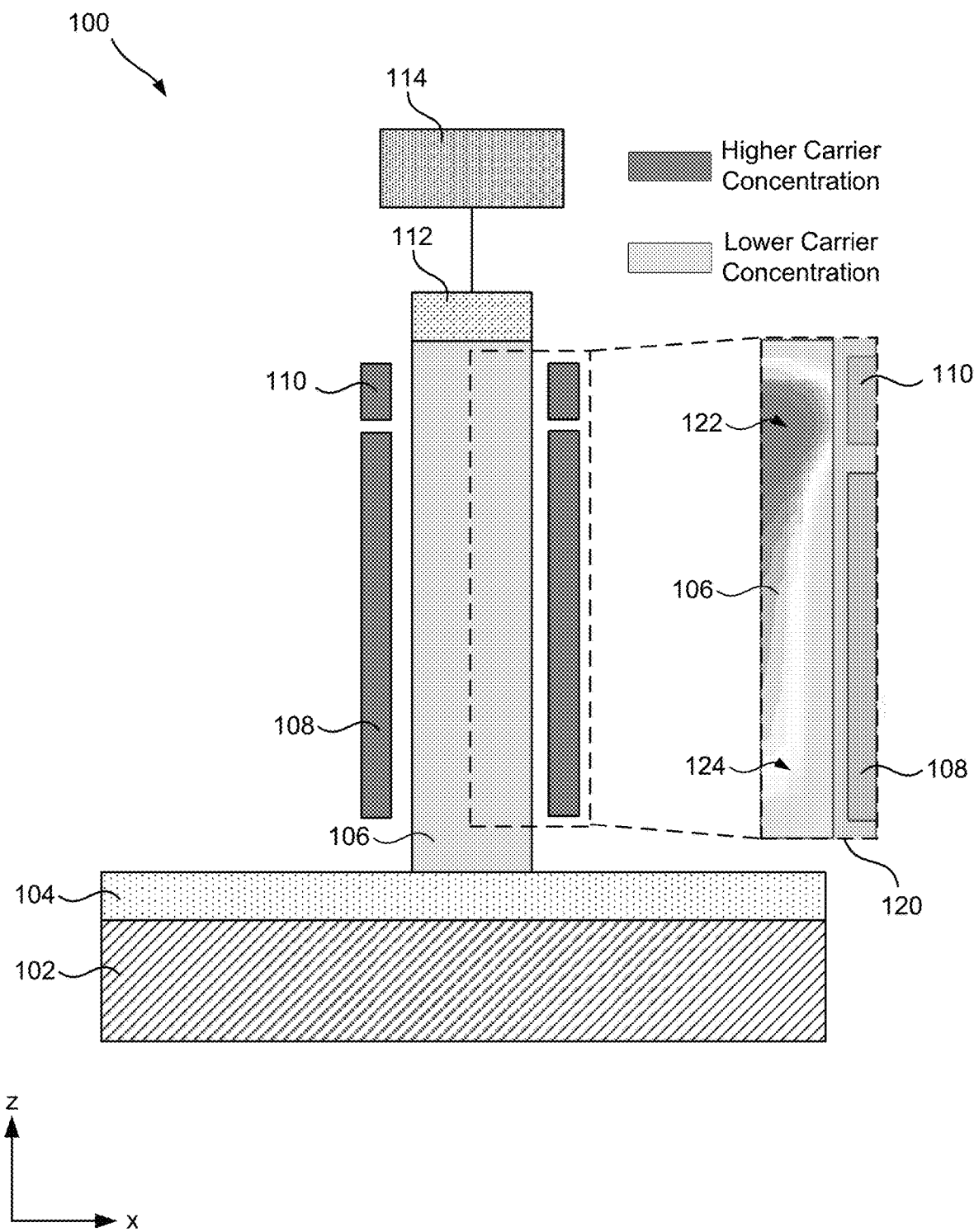
FIG. 1A illustrates a schematic cross-sectional view of an exemplary vertical memory cell, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

A dynamic random access memory (DRAM) is a type of random access semiconductor memory that can store each bit of data in a memory cell. Certain types of memory cells include a capacitor and an array transistor, also referred to as a 1T1C memory structure. The capacitor can be set to either a charged or discharged state, representing the bit value of zero and one, respectively. As DRAM technology progresses towards higher device densities and higher storage capacities, the number of capacitors drastically increases while the footprint of each capacitor is reduced. The changes of the number and size of the capacitors can result in a longer process time and a more complex process flow. Capacitor-less one transistor memory structures, also referred to as 1T memory structures, have been developed to improve device density and storage capacities. However, capacitor-less one transistor memory structures face challenges such as word line floating body capacitive coupling, which impacts device performance.

Various embodiments in accordance with the present disclosure provide structures and fabricating methods for capacitor-less multi-gate vertical 1T memory structures that improves data retention and reduces leakage current. The capacitor-less multi-gate vertical 1T memory structures can include a pillar, such as a vertical pillar-shaped floating body, and multiple gates surrounding the pillar. In some embodiments, the pillar can be surrounded by a top selection gate, a plate line gate, and a bottom selection gate. In some embodiments, the pillar can be surrounded by a word line gate, a bias gate, and a plate line gate. Bit lines can be formed above the pillar. A memory cell is formed at the intersection between a word line and a bit line. The capacitor-less multi-gate vertical 1T memory structures of the present disclosure can provide various benefits, including but not limited to, improved transistor carrier density, improved program/erase speeds, among other things.

Figure 1B:
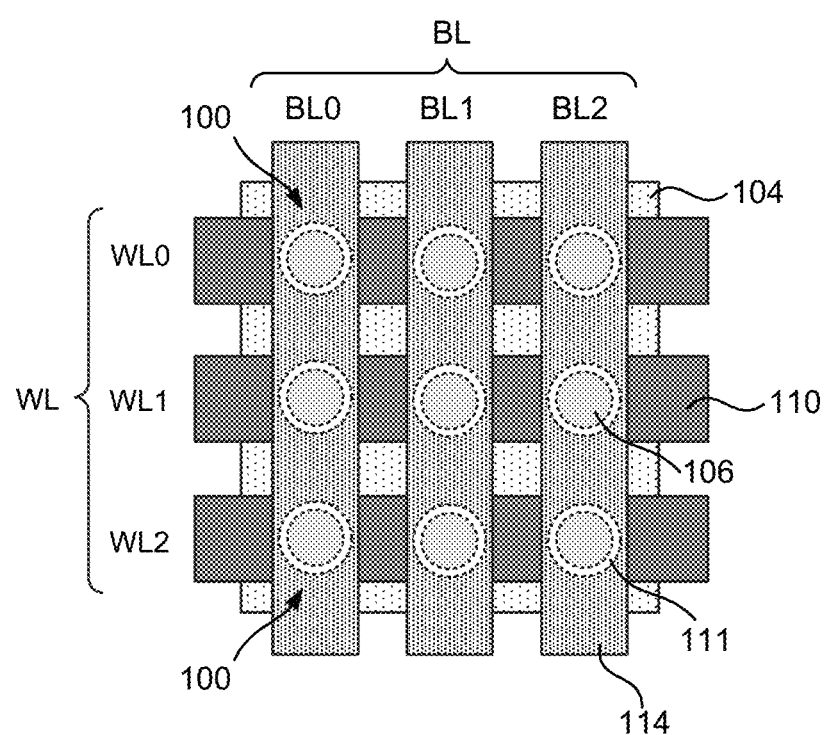
FIG. 1B illustrates a schematic top-down view of a memory array, according to some embodiments of the present disclosure.

FIGS. 1A and 1B are illustrations of memory structures, according to some embodiments of the present disclosure. FIG. 1A illustrates a cross-sectional view of a capacitor-less dual-gate vertical 1T memory cell 100. Memory cell 100 can be formed on substrate 102 and can include a source line 104, a pillar 106, a plate line gate 108, a word line 110, a drain cap 112, and a bit line 114. FIG. 1B is a top-down view of memory array 150 that includes multiple memory cells 100. Additional structures can be included and are not illustrated in FIGS. 1A and 1B for simplicity.

Substrate 102 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials, and any combinations thereof. In some embodiments, substrate 102 can be double-side polished prior to peripheral device fabrication. In this example, substrate 102 includes surfaces on the top and bottom sides both polished and treated to provide a smooth surface for high quality semiconductor devices. In some embodiments, substrate 102 can be a dielectric layer formed of silicon, silicon oxide, silicon nitride, or any suitable dielectric material.

Source line 104 can be formed on substrate 102. In some embodiments, source line 104 can be a conductive structure, such as a semiconductor layer doped with suitable dopants. In some embodiments, source line 104 can be formed of a silicon material and doped with n-type dopants, such as phosphorus, arsenic, antimony, bismuth, lithium, and/or combinations thereof. In some embodiments, the dopant concentration of the n-type dopants can be between about $1\times10^{18}$ atom/cm$^3$ to about $1\times10^{22}$ atom/cm$^3$. In some embodiments, the dopant concentration of n-type dopants can be greater than about $1\times10^{20}$ atom/cm$^3$.

Pillar 106 can be formed on and electrically coupled to source line 104. Pillar 106 can extend in a vertical direction (e.g., z direction) with reference to a top surface of substrate 102. In some embodiments, pillar 106 can be formed of a pillar structure, such as having a cylindrical body with a rectangular cross-sectional shape. Pillar 106 can be formed of a semiconductor material doped with suitable dopants. For example, pillar 106 can be a silicon material doped with p-type dopants, such as boron, aluminum, nitrogen, gallium, indium, and/or combinations thereof. In some embodiments, the dopant concentration of the p-type dopants can be between about $1\times10^{10}$ atom/cm$^3$ to about $1\times10^{20}$ atom/cm$^3$. In some embodiments, pillar 106 can be formed using an intrinsic semiconductor material, such as intrinsic polycrystalline silicon.

Plate line 108 is formed adjacent to pillar 106. In some embodiments, plate line 108 surrounds a lower portion of the sidewall surfaces of pillar 106. For example, the sidewall surface of plate line 108 can be positioned around a circumference of pillar 106. In some embodiments, the sidewall surface of plate line 108 can be concentric with the sidewall surface of pillar 106. In some embodiments, a dielectric layer 111 (not illustrated in FIG. 1A but illustrated in FIG. 1B) can be disposed between plate line 108 and pillar 106. Plate line 108 can be formed using a suitable conductive material, such as tungsten, cobalt, copper, aluminum, polysilicon, doped silicon, silicides, and/or combinations thereof.

Word line 110 is formed adjacent to pillar 106 and above plate line 108. In some embodiments, pillar 106 can be formed of a pillar structure and word line 110 surrounds an upper portion of the sidewall surfaces of pillar 106. In some embodiments, a dielectric layer 111 (not illustrated in FIG. 1A but illustrated in FIG. 1B) can be disposed between word line 110 and pillar 106. Word line 110 can be formed using a suitable conductive material, such as tungsten, cobalt, copper, aluminum, polysilicon, doped silicon, silicides, and/ or combinations thereof.

Drain cap 112 can be formed on pillar 106, according to some embodiments. In some embodiments, drain cap 112 can be formed of a semiconductor material doped with suitable dopants, such as n-type dopants. such as phosphorus, arsenic, antimony, bismuth, lithium, and/or combinations thereof. In some embodiments, the dopant concentration of the n-type dopants can be between about $1\times10^{18}$ atom/cm$^3$ to about $1\times10^{22}$ atom/cm$^3$. In some embodiments, the dopant concentration of n-type dopants can be greater than about $1\times10^{20}$ atom/cm$^3$. In some embodiments, drain cap 112 can be formed by doping a top portion of pillar 106 with n-type dopants.

Bit line 114 is formed above and electrically coupled to drain cap 112, according to some embodiments. In some embodiments, bit line 114 can be formed using a suitable conductive material, such as tungsten, cobalt, copper, aluminum, polysilicon, doped silicon, silicides, and/or combinations thereof.

Enlarged view 120 illustrates a charge carrier concentration distribution within pillar 106 after a program scheme is performed on memory cell 100. In some embodiments, the majority charge carriers within pillar 106 are electron holes, i.e., the absence of an electron in the atoms. After a program scheme is performed on memory cell 100, the generated holes are non-uniformly distributed within pillar 106. A higher charge carrier concentration zone 122 of holes is located in an upper region of pillar 106 and in proximity to word line 110. In some embodiments, a higher charge carrier concentration can be between about $3 \times 10^{15}$ cm$^{-3}$ and about $3 \times 10^{18}$ cm$^{-3}$. In some embodiments, charge carrier concentration can decrease towards a lower region of pillar 106, resulting in a lower charge carrier concentration zone 124 of holes located in a portion of pillar in proximity of source line 104. In some embodiments, a lower charge carrier concentration can be between about $1 \times 10^{7}$ cm$^{-3}$ and about $5 \times 10^{12}$ cm$^{-3}$. In some embodiments, lower charge carrier concentration zone 124 can cause leakage current to flow between pillar 106 and source line 104, resulting in a reduction in memory cell data retention which in turn reduces device performance of memory cell 100.

FIG. 1B illustrates a top-down view of a memory array 150 formed of capacitor-less dual-gate vertical 1T memory cells, according to some embodiments of the present disclosure. The 1T memory cells can be the memory cell 100 described in FIG. 1A. Elements corresponding to those in FIG. 1A are designated by similar numeral references. Memory array 150 can include additional memory cells that are not illustrated for simplicity.

Multiple bit lines and word lines are intersected to form memory array 150. As shown in FIG. 1B, multiple word lines 110 can extend in a first lateral direction (e.g., x direction) and designated as WL0, WL1, and WL2, etc. Similarly, multiple bit lines 112 can extend in a second lateral direction (e.g., y direction) and designated as BL0, BL1, and BL2, etc. A memory cell is formed at an intersection of a word line and a bit line. For example, memory cell 100 can be formed at the intersection of WL0 and BL0 and at the intersection of WL2 and BL0.

Figure 2:
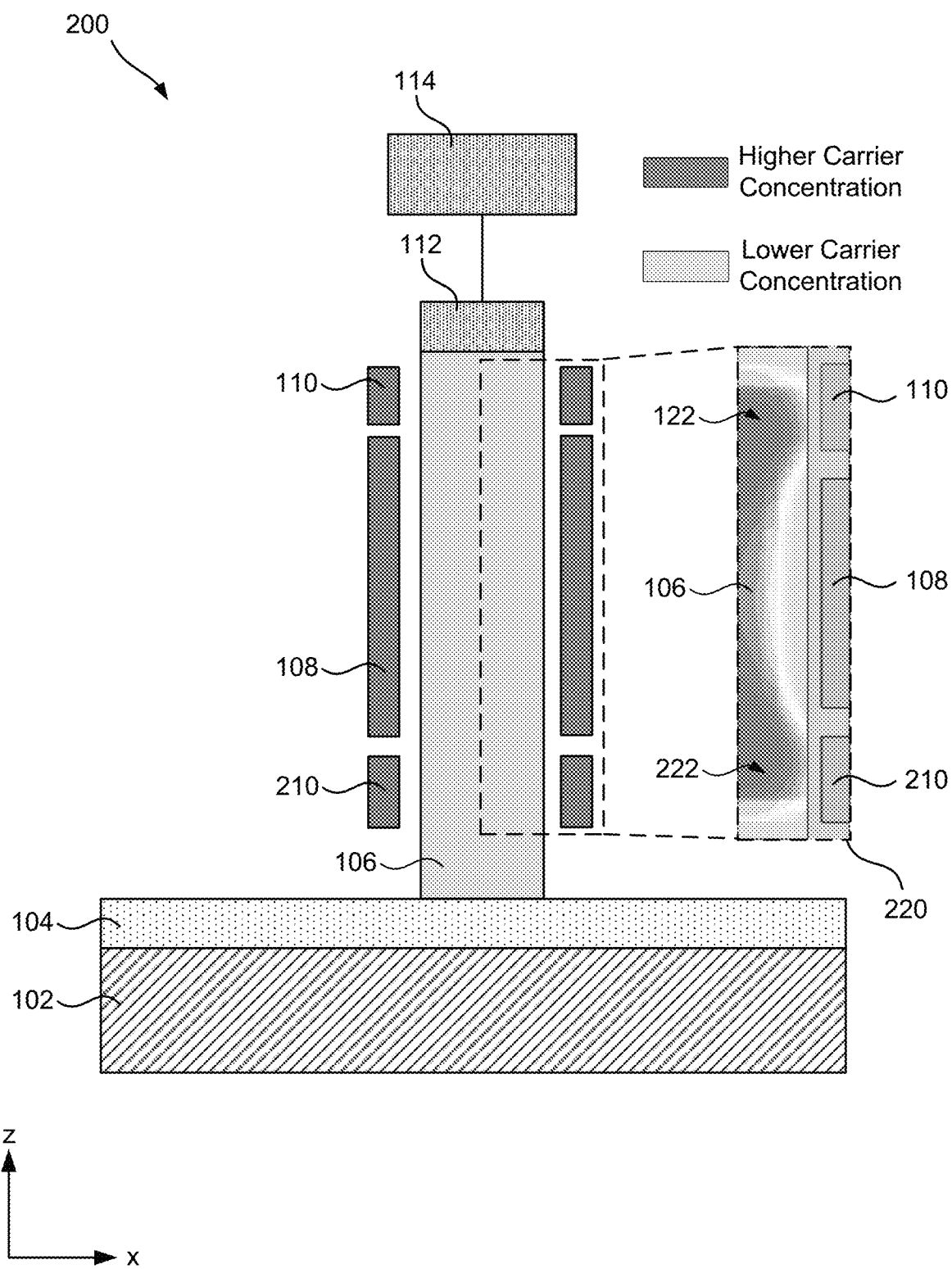
FIG. 2 illustrates a schematic cross-sectional view of an exemplary vertical memory cell incorporating a bottom select gate (BSG), according to some embodiments of the present disclosure.

FIG. 2 illustrates a cross-sectional view of a capacitor-less vertical 1T memory cell 200 with a bottom select gate (BSG) for reducing leakage current and improving data retention. Elements corresponding to those in FIG. 1A are designated by similar numeral references.

As shown in FIG. 2, a bottom gate such as BSG 210 is formed between plate line 108 and source line 104. In some embodiments, pillar 106 can be formed of a pillar structure and BSG 210 can be disposed to surround a lower portion of the sidewall surfaces of pillar 106. In some embodiments, a dielectric layer can be disposed between BSG 210 and pillar 106. BSG 210 can be formed using a suitable conductive material, such as tungsten, cobalt, copper, aluminum, polysilicon, doped silicon, silicides, and/or combinations thereof. By applying a nominal voltage bias to BSG 210, a higher charge carrier concentration zone can be formed in lower portion of pillar 106 which in turn can reduce leakage current and improve data retention of memory cell 200. Enlarged view 220 illustrates a charge carrier concentration distribution within pillar 106 after a program scheme is performed on memory cell 200. Similar to memory cell described in FIG. 1A, the majority charge carriers within pillar 106 can be electron holes. After a program scheme is performed on memory cell 200, the generated holes are non-uniformly distributed within pillar 106. A higher charge carrier concentration zone 122 of holes is located in an upper region of pillar 106 and in proximity to word line 110. Another higher charge carrier concentration zone 222 of holes is located in a lower region of pillar 106 and proximate to BSG 220. The higher charge carrier concentration zone 222 can be a saturation zone that prevents the formation of leakage current. In some embodiments, a charge carrier concentration of higher charge carrier concentration zone 222 can be between about $3 \times 10^{15}$ cm$^{-3}$ and about $3 \times 10^{18}$ cm$^{-3}$.

Figure 3:
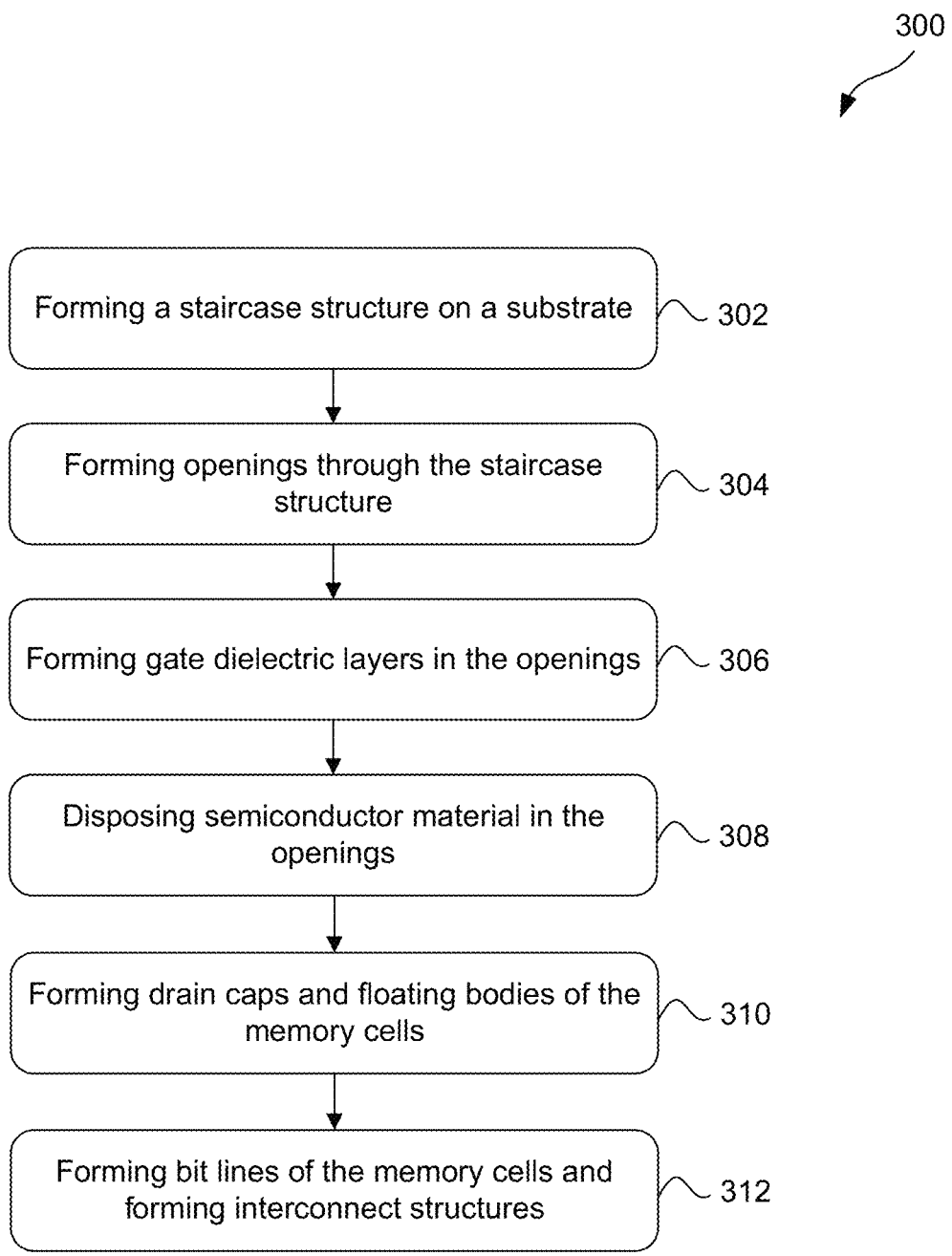
FIG. 3 illustrates a flow diagram of forming a memory structure having bottom select gates, in accordance with some embodiments of the present disclosure.

FIG. 3 illustrates a method for forming a capacitor-less 1T memory cell with a BSG for reducing leakage current and improving data retention, in accordance with some embodiments of the present disclosure. The operations of method 300 can be performed in a different order and/or vary, and method 300 can include more operations that are not described for simplicity. FIGS. 4A-4G are cross-sectional views of fabricating an exemplary memory structure 400 incorporating BSG structures. FIGS. 4A-4G are provided as exemplary cross-sectional views to facilitate in the explanation of method 300. The fabrication processes provided here are exemplary, and alternative processes in accordance with this disclosure may be performed that are not shown in these figures. Additional layers and/or structures can be formed in memory structure 400 and are not illustrated in FIGS. 4A-4G for simplicity.

Figure 4A:
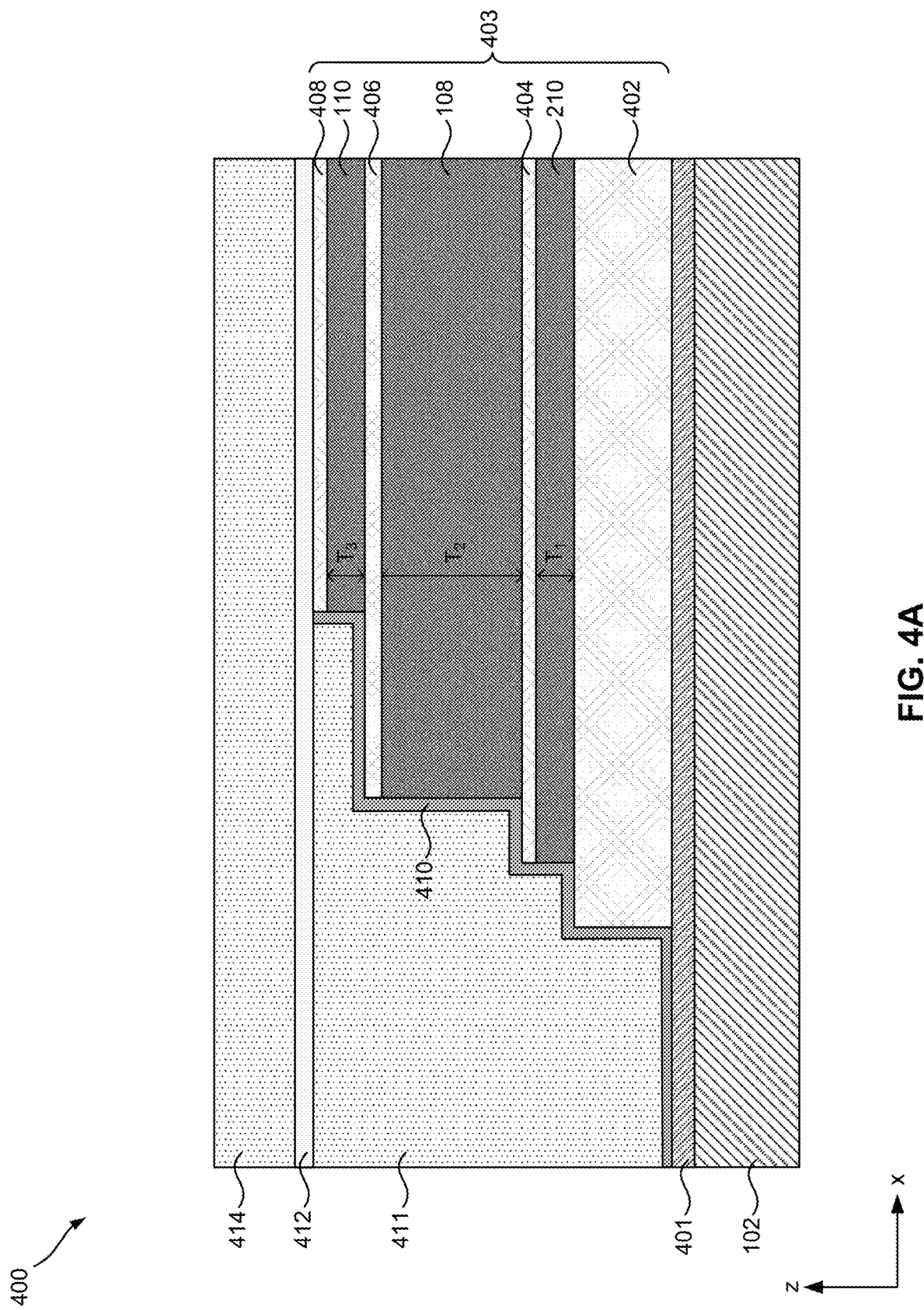
FIGS. 4A-4G illustrate cross-sectional views of a memory structure at various process stages, according to some embodiments of the present disclosure.

At operation 302, a staircase structure is formed on a substrate, according to some embodiments of the present disclosure. Referring to FIG. 4A, memory structure 400 can include a substrate 102, a conductive line 401, dielectric layers 402, 404, 406, and 408, a BSG 210, a plate line 108, a word line 110, a liner layer 410, insulating layers 411 and 414, and an etch stop layer 412. At least BSG 210, plate line 108, and word line 110 can be formed with a lateral offset with respect to another to form a staircase structure. Elements corresponding to those in FIGS. 1A and 2 are designated by similar numeral references.

Substrate 102 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some embodiments, substrate 102 can be a dielectric layer, such as silicon oxide, silicon nitride, silicon oxynitride, and the like.

Conductive line 401 can be formed on substrate 102. In some embodiments, conductive line 401 can be a conductive structure, such as a metal line or a semiconductor layer doped with suitable dopants. For example, conductive line 401 can be formed of tungsten, cobalt, copper, aluminum, any suitable metal, and/or combinations thereof. Conductive line 401 can be disposed using thin-film deposition processes including, but not limited to, chemical vapor deposition (CVD), plasma-enhanced CVD (PECVD), physical vapor deposition (PVD), atomic layer deposition (ALD), plasma-enhanced ALD (PEALD), and/or any combinations thereof.

A staircase structure 403 can include at least BSG 210, plate line 108, and word line 110. Each of the aforementioned layers can be formed with a lateral offset with respect to another, such that the lateral offsets form a shape of a staircase to allow an electrical connection to each tier of the layers. In some embodiments, staircase structure 403 can also include dielectric layers 404, 406, and 408 that are respectively formed on BSG 210, plate line 108, and word line 110.

Thicknesses of BSG 210, plate line 108, and word line 110 can affect the charge carrier concentration of a subsequently formed pillar that extends through staircase structure 403. In some embodiments, a thickness $T_1$ of BSG 210 can be between about 15 nm and about 80 nm. In some embodiments, a thickness $T_2$ of plate line 108 can be between about 60 nm and about 300 nm. In some embodiments, a thickness $T_3$ of word line 110 can be between about 15 nm and about 80 nm. In some embodiments a ratio of thickness $T_1$ over thickness $T_2$ can be about 1:4. In some embodiments, a ratio of thickness $T_2$ over thickness $T_3$ can be about 4:1.

BSG 210, plate line 108, and word line 110 can be formed using one or more conductive materials. For example, the conductive materials can include tungsten, cobalt, copper, aluminum, polysilicon, doped silicon, silicides, and/or combinations thereof. Liner layer 410, insulating layers 411 and 414, etch stop layer 412, and dielectric layers 402, 404, 406, and 408 can be formed using one or more dielectric materials, such as silicon oxide, silicon nitride, silicon oxynitride, silicon carbon nitride, any suitable dielectric material, and/or combinations thereof.

Liner layer 410, insulating layers 411 and 414, etch stop layer 412, dielectric layers 402, 404, 406, and 408 and the layers of staircase structure 403, such as BSG 210, plate line 108, word line 110, and dielectric layers 402, 404, 406, and 408 can be disposed using suitable deposition methods. For example the deposition methods can include CVD, PVD, PECVD, ALD, high-density-plasma CVD (HDP-CVD), sputtering, spin-coating, or any combination thereof.

Figure 4B:
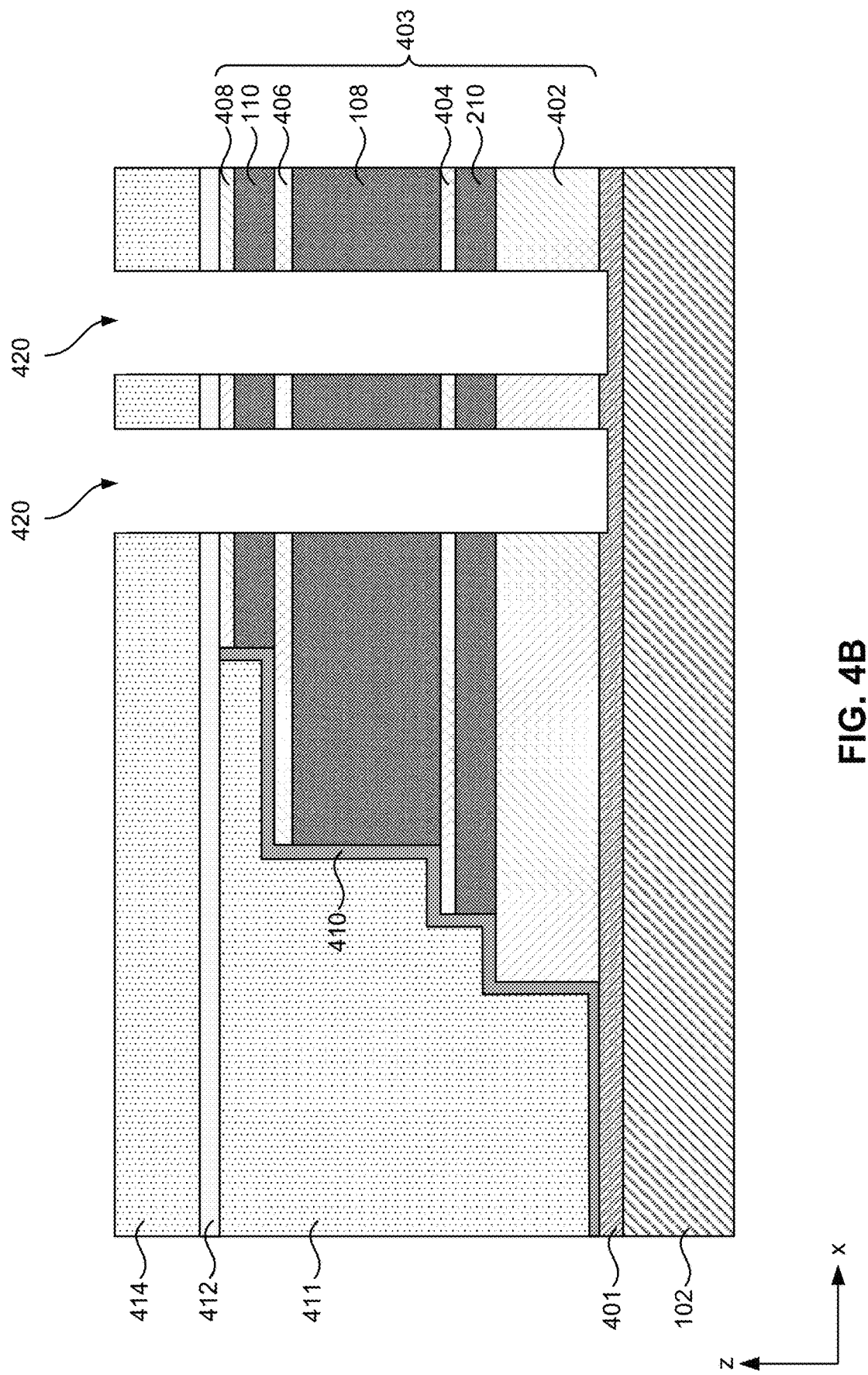

At operation 304, openings can be formed through the staircase structure, according to some embodiments of the present disclosure. Referring to FIG. 4B, openings 420 can be formed by etching portions of insulating layer 414, etch stop layer 412, and staircase structure 403 until conductive line 401 is exposed. In some embodiments, openings 420 can be a cylindrical hole having a substantially rectangular cross-sectional area. A photolithography process can be used to expose portions of the top surface of insulating layer 414 to be etched. Dry plasma etching processes or wet chemical etching processes can be used to sequentially remove portions of insulating layer 414, etch stop layer 412, and staircase structure 403 until conductive line 401 is exposed. The etching processes can include multiple etching processes, each configured to remove the type of material that is exposed. Specifically, the etchants used in each etching process can be selected based on the material composition of insulating layer 414, etch stop layer 412, dielectric layers 402, 404, 406, and 408, and the conductive materials that form BSG 201, plate line 108, and word line 110. For example, the etching processes can include suitable etchants for removing $SiO_2$, SiN, and conductive materials such as tungsten. The etching processes continue until a top surface of conductive line 401 is exposed. In some embodiments, openings 420 extend into conductive line 401 to ensure that conductive line 401 is exposed within openings 420. Masking layers such as photoresists can be removed after openings 420 are formed.

Figure 4C:
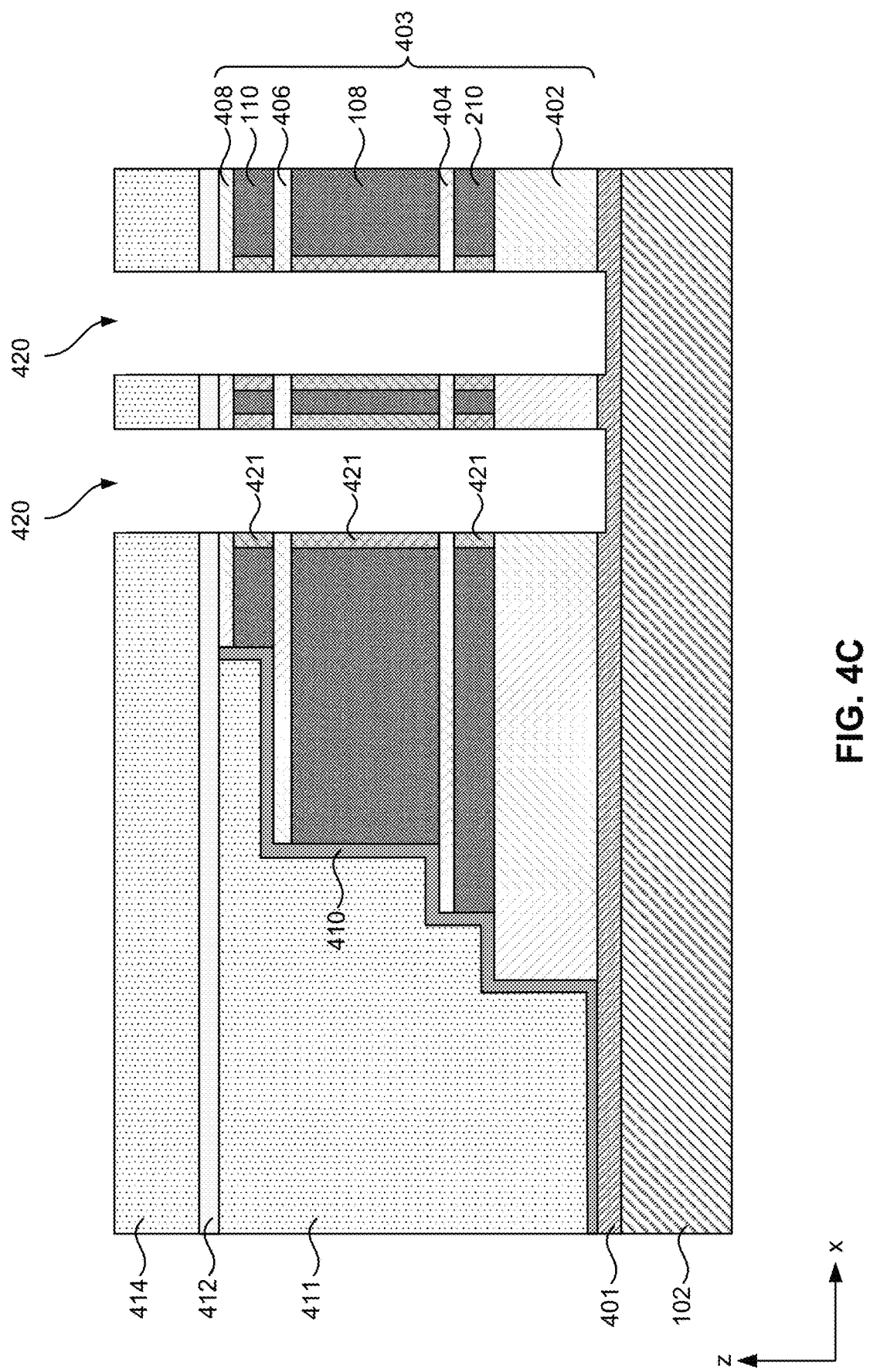

At operation 306, gate dielectric layers can be formed in the openings, according to some embodiments of the present disclosure. Referring to FIG. 4C, gate dielectric layers 421 can be formed in openings 420 and in contact with gate structures including BSG 210, plate line 108, and word line 110. In some embodiments, an etch-back process can be performed before the formation of gate dielectric layers. For example, BSG 201, plate line 108, and word line 110 can be laterally etched back and a gate dielectric layer can be disposed on the etched-back gates. In some embodiments, gate dielectric layer 421 can be formed by uniformly disposing a gate dielectric material on all exposed surfaces in openings 420 followed by an anisotropical etching process such that disposed gate dielectric material remains in contact with the gate structure and the adjacent dielectric layers. For example, gate dielectric layer 421 is in contact with BSG 210 and dielectric layers 402 and 404. Similarly, gate dielectric layer 421 is in contact with plate line 108 and dielectric layers 404 and 406. Further, gate dielectric layer 421 is in contact with word line 110 and dielectric layers 406 and 408. In some embodiments, vertical sidewalls of gate dielectric layers 421 are coplanar with the vertical sidewalls of dielectric layers 404, 406, and 408.

Figure 4D:
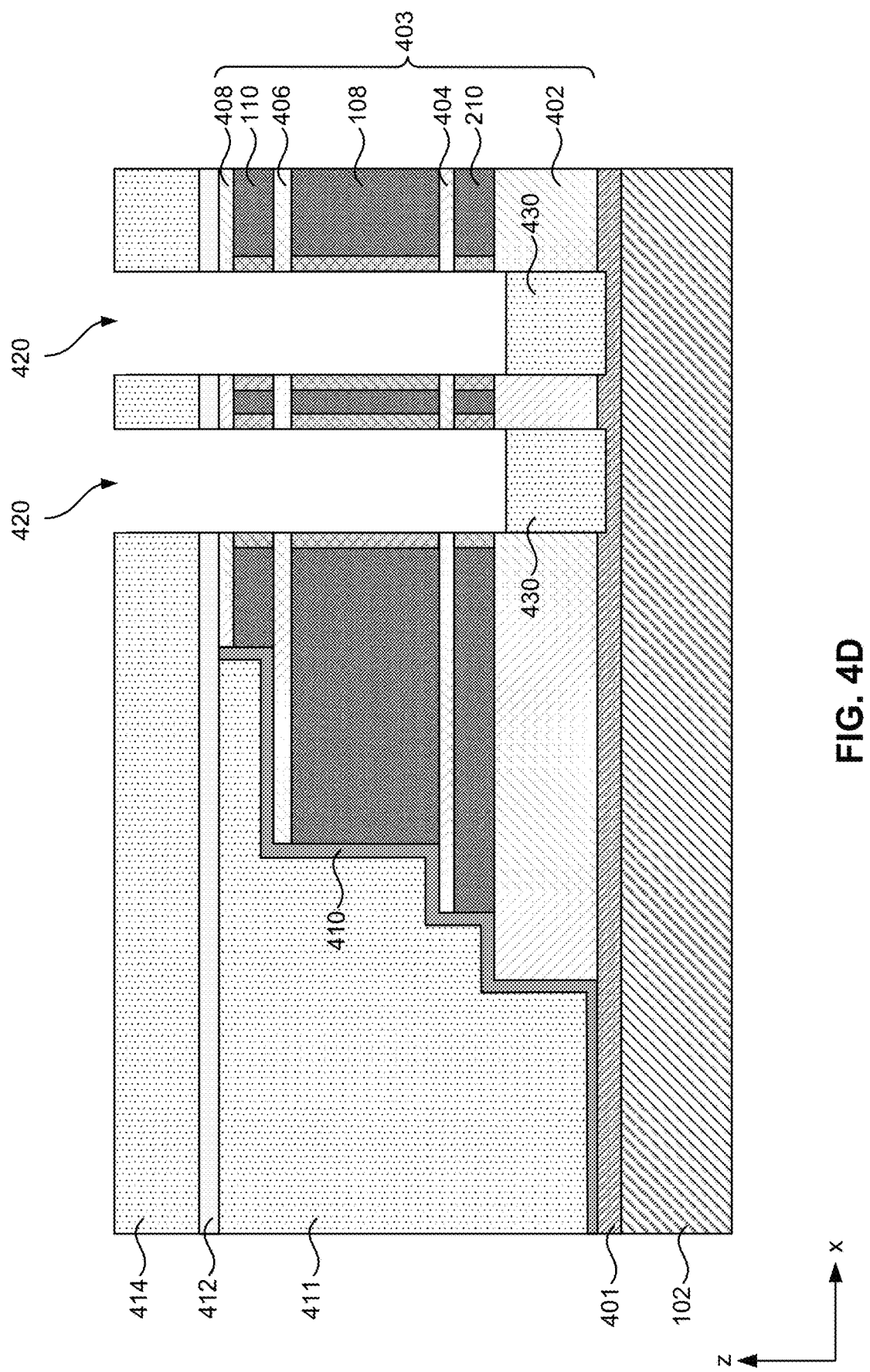

At operation 308, source lines of the memory cell can be formed in the openings, according to some embodiments of the present disclosure. Referring to FIG. 4D, source line 430 is formed at the bottom of openings 420 and in contact with conductive line 401 and dielectric layer 402. In some embodiments, source line 430 can be formed of a silicon material and doped with n-type dopants, such as phosphorus, arsenic, antimony, bismuth, lithium, and/or combinations thereof. In some embodiments, source line 430 can be single crystalline silicon and formed using an epitaxial growth process using conductive line 401 as a seed layer. In some embodiments, source line 430 can be similar to source line 104 described in FIGS. 1A, 1B, and 2.

Figure 4E:
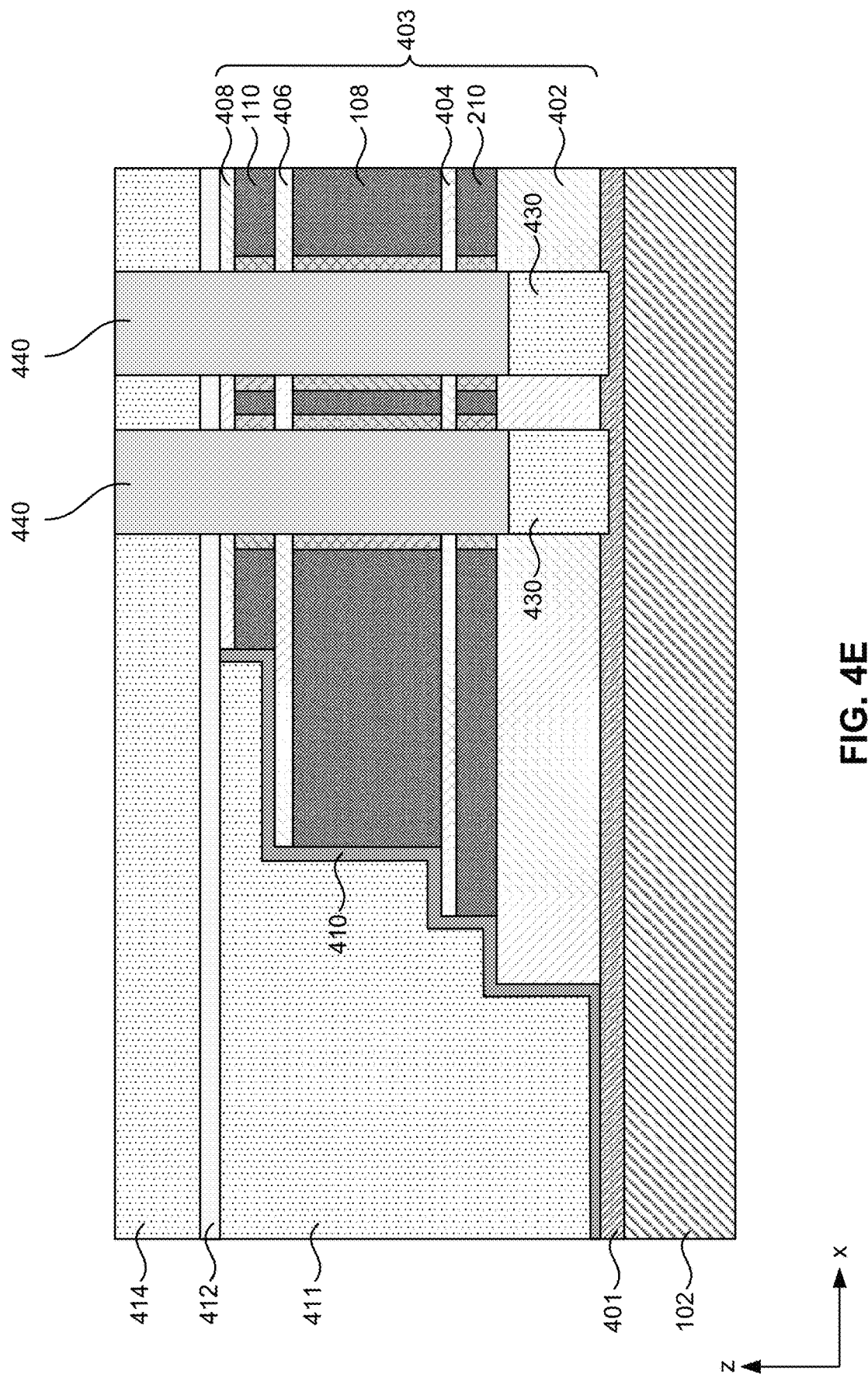

At operation 308, semiconductor materials are disposed to fill the openings, according to some embodiments of the present disclosure. Referring to FIG. 4E, semiconductor material 440 can be formed in openings 420 and in contact with source line 430 and gate dielectric layer 421. In some embodiments, semiconductor material 440 extends through the entirety of openings 420 and a planarization process is performed such that top surfaces of semiconductor material 440 are coplanar with the top surface of insulating layer 414. In some embodiments, semiconductor material 440 can be formed using a silicon material, such as polysilicon material or single crystalline silicon material. In some embodiments, semiconductor material 440 can be an intrinsic material or doped with suitable dopants, such as one or more p-type dopants. For example, semiconductor material 440 can be doped with p-type dopants such as boron, aluminum, nitrogen, gallium, indium, and/or combinations thereof.

Figure 4F:
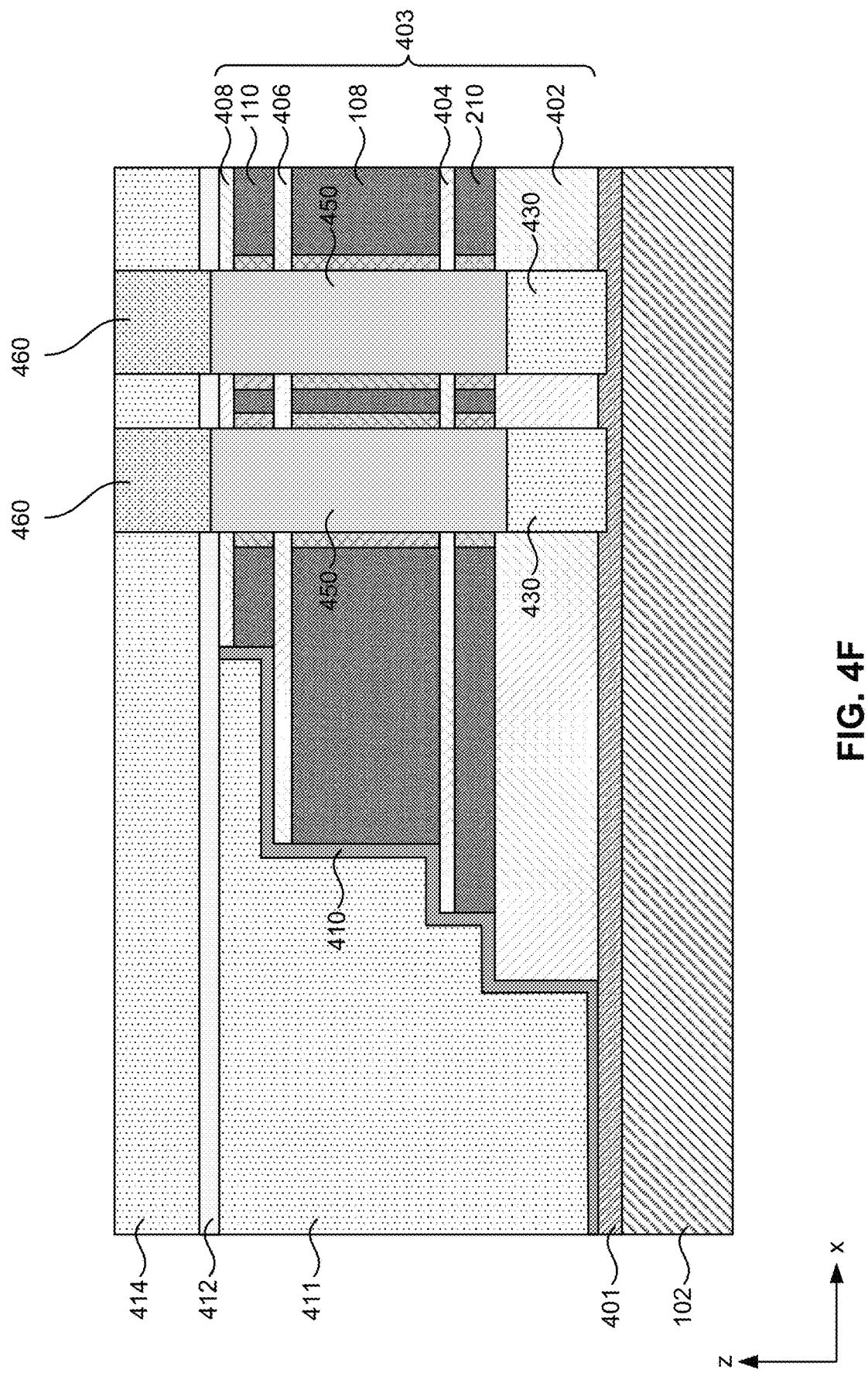

At operation 310, drain caps and floating bodies of the memory cell can be formed, according to some embodiments of the present disclosure. Referring to FIG. 4F, drain caps 460 can be formed by doping top portions of semiconductor material 440 illustrated in FIG. 4E. The remaining portion of semiconductor material 440 between its doped top portion and source line 430 can form pillar 450. In some embodiments, dopants used in an ion implantation process for doping the top portion of semiconductor material 440 can be an opposite type of dopants used in the formation of semiconductor material 440. For example, semiconductor material 440 described in FIG. 4E can be doped with a p-type dopant and drain caps 460 can be doped with an n-type dopant. In some embodiments, pillar 450 is a pillar structure that extends in the vertical direction (e.g., z direction) and its sidewall is surrounded by BSG 210, plate line 108, and word line 110. In some embodiments, as shown in FIG. 4F, a top surface of pillar 450 is at a horizontal plane that is above the top surface of word line 110, and a bottom surface of pillar 450 is at a horizontal plane that is below the bottom top surface of BSG 210.

Figure 4G:
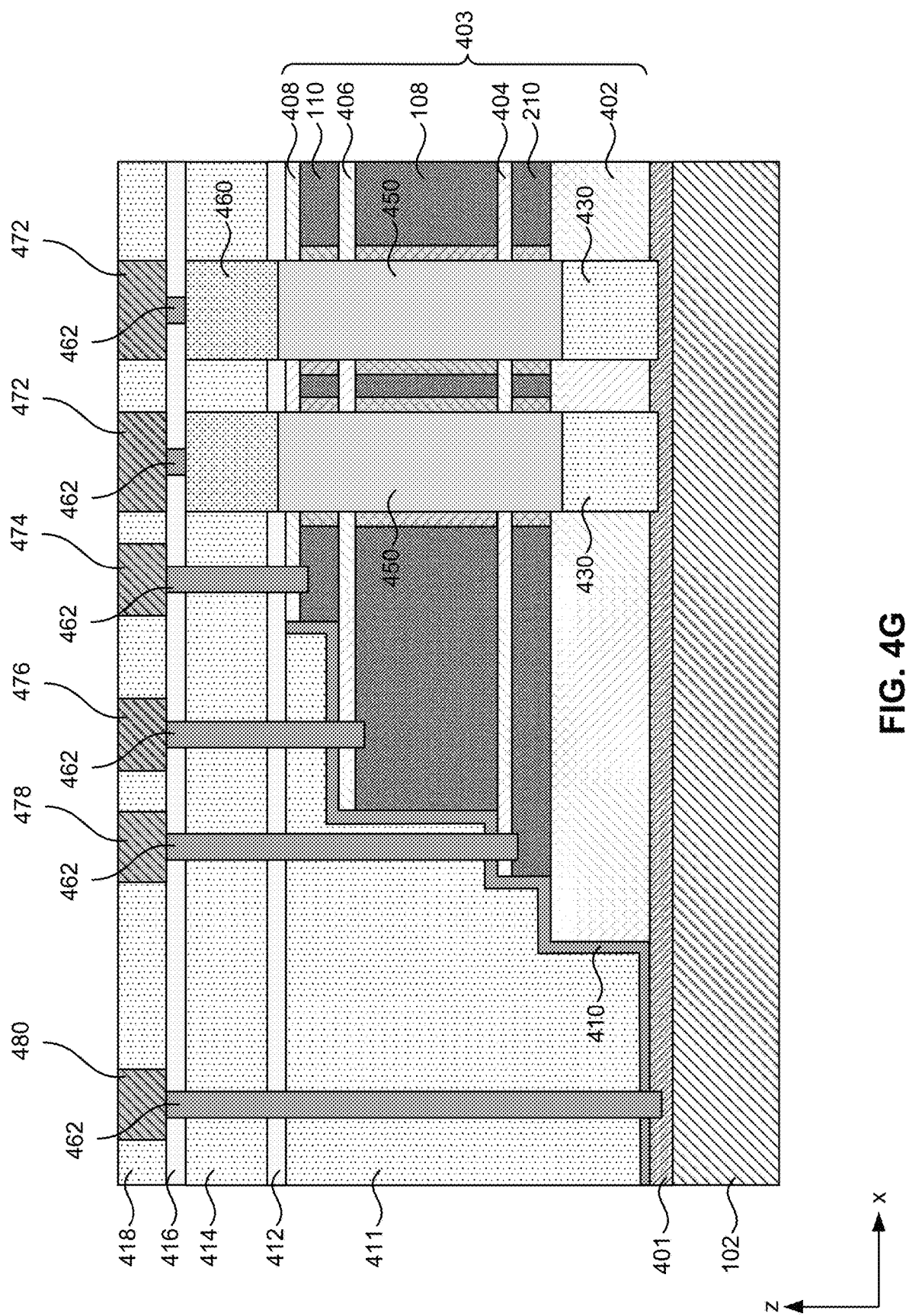

At operation 312, bit lines and interconnect structures of the memory cells can be formed, according to some embodiments of the present disclosure. Referring to FIG. 4G, vias 462 can extend through etch stop layer 412 and insulating layers 411 and 414. In some embodiments, vias 462 can also extend through liner layer 410. Vias 462 can be in contact with and electrically coupled to conductive line 401, BSG 210, plate line 108, and word line 110 for providing voltage bias and/or transmitting electrical signals to the gate structures. In some embodiments, additional etch stop layer 416 and insulating layer 418 can be disposed on insulating layer 414. The composition of etch stop layers 416 and insulating layer 418 can be similar to etch stop layer 412 and insulating layer 414, respectively, and are not described in detail for simplicity. Bit lines 472 can be formed in insulating layer 418 and electrically coupled to drain cap 460 through vias 462. Similarly, word line contact 474 can be formed in insulating layer 418 and electrically coupled to word line 110 through via 462. In some embodiments, plate line contact 476 can be formed in insulating layer 418 and electrically coupled to plate line 108 through via 462. In some embodiments, BSG contact 478 can be formed in insulating layer 418 and electrically coupled to BSG 210 through via 462. In some embodiments, source line contact 480 can be formed in insulating layer 418 and electrically coupled to source line 430 through vias 462 and conductive line 401.

Figure 5B:
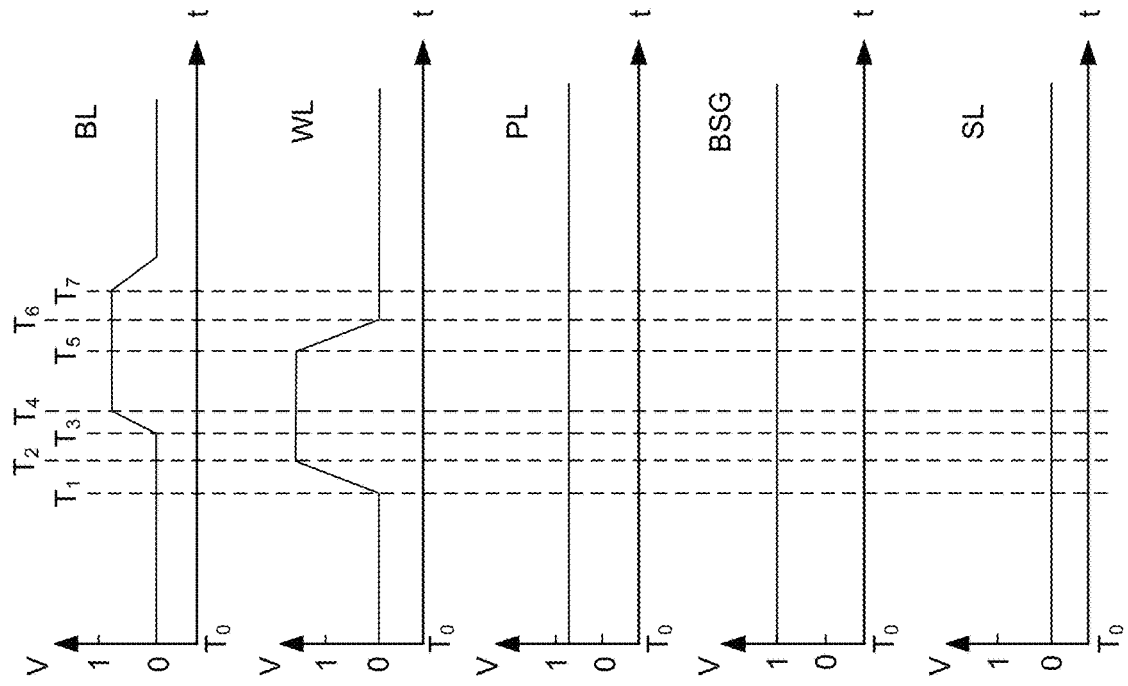
FIG. 5B illustrates an operation diagram of performing a programming scheme on a memory structure having bottom select gates, in accordance with some embodiments of the present disclosure.
Figure 5A:
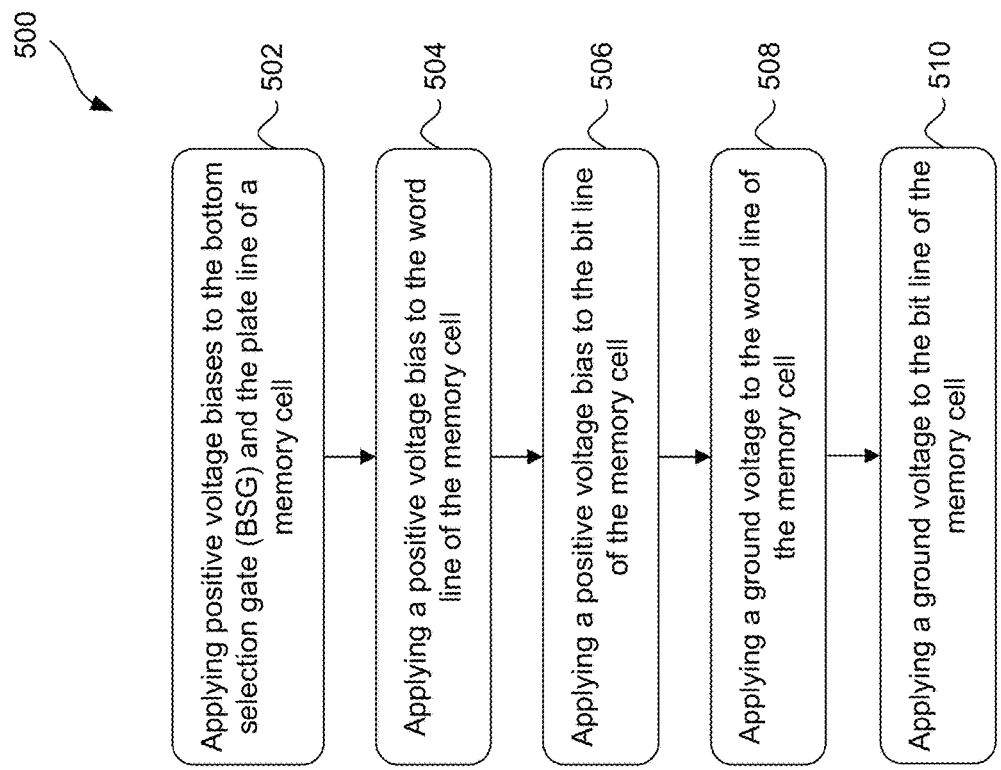
FIG. 5A illustrates a flow diagram of performing a programming scheme on a memory structure having bottom select gates, in accordance with some embodiments of the present disclosure.

FIG. 5A illustrates a method 500 for operating a programming scheme on a capacitor-less 1T memory cell with a BSG for reducing leakage current and improving data retention, in accordance with some embodiments of the present disclosure. The operations of method 500 can be performed in a different order and/or vary, and method 500 can include more operations that are not described for simplicity. FIG. 5B is an operation diagram of programing a capacitor-less 1T memory cell incorporated with a BSG, according to some embodiments. FIG. 5B is provided as exemplary voltage-over-time operation diagrams to facilitate in the explanation of method 500. The operations provided here are exemplary, and alternative operations in accordance with this disclosure may be performed that are not shown in these figures. Additional operations can be performed in method 500 and are not illustrated in FIGS. 5A and 5B for simplicity.

FIG. 5B illustrates an operation diagram for a programming scheme on a capacitor-less 1T memory cell, such as memory structure 400 described in FIG. 4G. As discussed with reference to FIG. 2, incorporating BSG in proximity to a lower portion of the pillar can improve data retention and reduce leakage current.

At operation 502, positive voltage biases are applied to the BSG and the plate line of a memory cell, according to some embodiments. In some embodiments, a positive voltage bias applied to the plate line can be between about 0.5 V and about 0.9 V. Using memory structure 400 of FIG. 4G as an example, a positive voltage bias of about 0.8 V can be applied to plate line 108 through plate line contact 476 and vias 462. In some embodiments, a positive voltage bias applied to BSG can be between about 0.9 V and about 1.1 V. Using memory structure 400 of FIG. 4G as an example, a positive voltage bias of about 1 V can be applied to BSG 210 through BSG contact 478 and vias 462. The positive voltage biases described herein are examples of voltage bias applied to plate line 108 and BSG 210. In some embodiments, any suitable positive biases can be used, such as positive voltage bias between about 0.5 V and about 2.0 V. In some embodiments, the BSG and plate line can remain under positive voltage bias during the programming scheme. In some embodiments, the source line is connected to a ground voltage during the programming scheme. In some embodiments, a ground voltage can be connected to BSG 210 after the programming scheme is completed. In some embodiments, plate line 108 remains under positive voltage bias after the programming scheme is completed.

At operation 504, a positive voltage bias is applied to the word line of the memory cell, according to some embodiments. In some embodiments, a positive voltage bias is applied to the word line at a first time point $T_1$. In some embodiments, a positive voltage bias applied to the word line can be between about 1.3 V and about 1.7 V. Using memory structure 400 of FIG. 4G as an example, a positive voltage bias of about 1.5 V can be applied to word line 110 through word line contact 474 and vias 462. In some embodiments, the word line reaches the applied positive voltage bias at second time point $T_2$.

At operation 506, a positive voltage bias is applied to the bit line of the memory cell, according to some embodiments. In some embodiments, a positive voltage bias is applied to the bit line at a third time point $T_3$ that occurred after second time point $T_2$. In some embodiments, a positive voltage bias applied to the bit line can be between about 0.6 V and about 1 V. Using memory structure 400 of FIG. 4G as an example, a positive voltage bias of about 0.7 V can be applied to bit line 472. In some embodiments, the bit line reaches the applied positive voltage bias at a fourth time point $T_4$.

At operation 508, a ground voltage is applied to the word line of the memory cell, according to some embodiments. In some embodiments, a ground voltage is applied to the word line at a fifth time point $T_5$ that occurred after fourth time point $T_4$. Using memory structure 400 of FIG. 4G as an example, the ground voltage can be applied to word line 110 through word line contact 474 and vias 462. In some embodiments, the word line reaches the ground potential at sixth time point $T_6$.

At operation 510, a ground voltage is applied to the bit line of the memory cell, according to some embodiments. In some embodiments, a ground voltage is applied to the bit line at a seventh time point $T_7$ that occurred after sixth time point $T_6$. Using memory structure 400 of FIG. 4G as an example, the ground voltage can be applied to bit line 472.

Figure 6B:
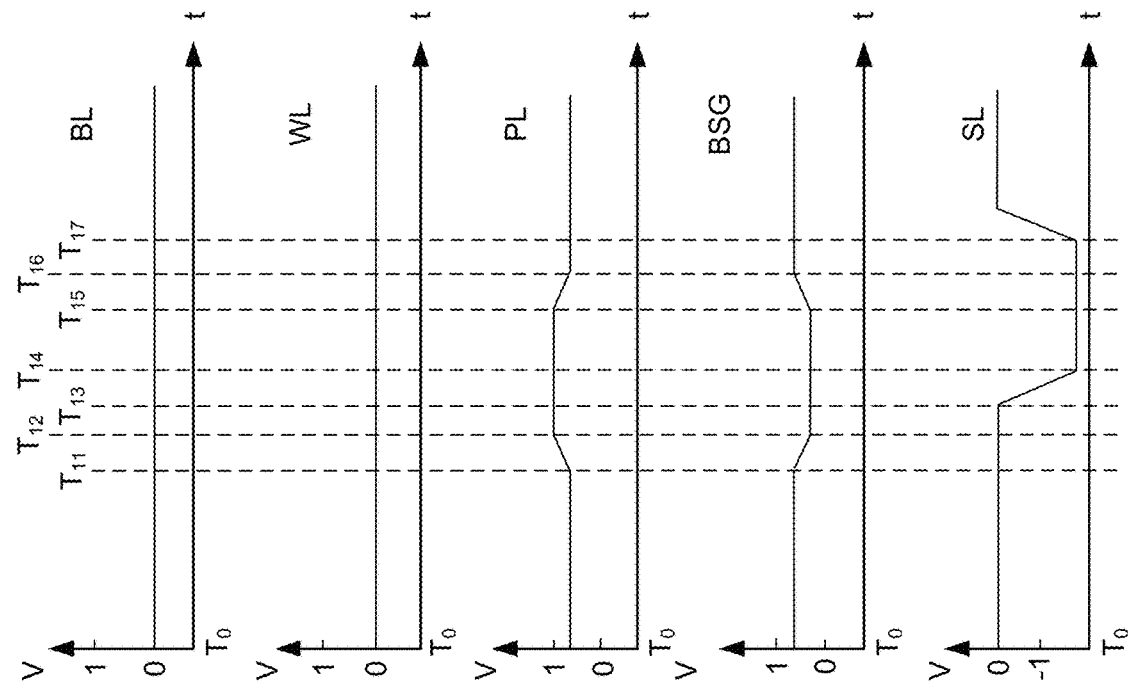
FIG. 6B illustrates an operation diagram of performing an erasing scheme on a memory structure having bottom select gates, in accordance with some embodiments of the present disclosure.
Figure 6A:
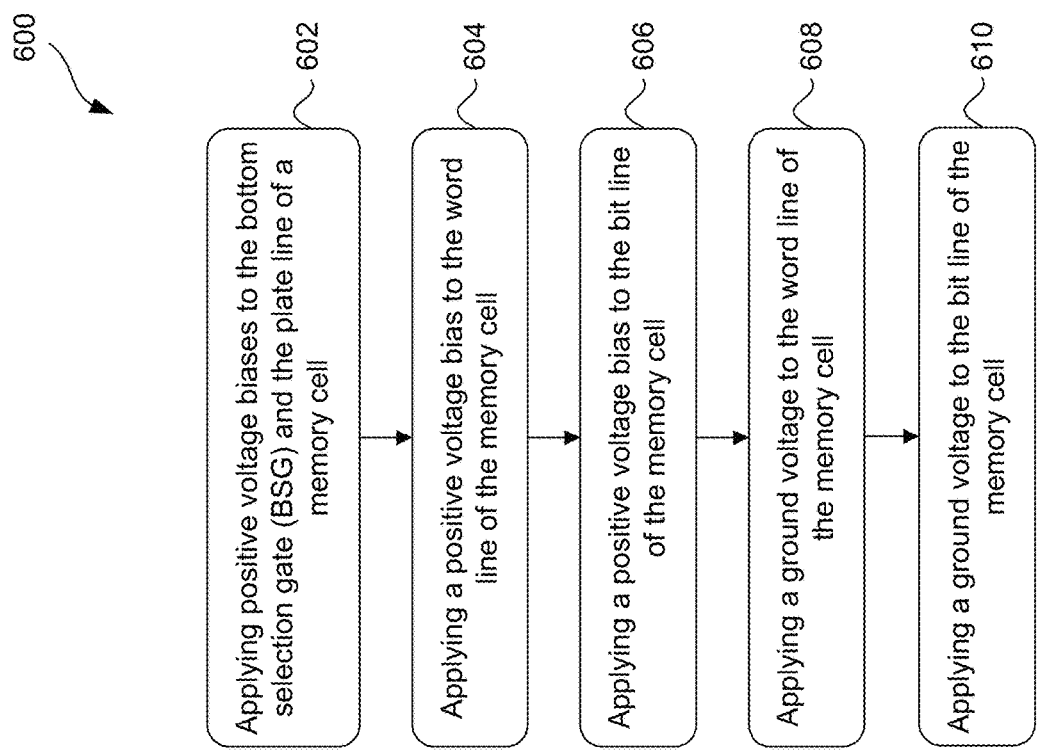
FIG. 6A illustrates a flow diagram of performing an erasing scheme on a memory structure having bottom select gates, in accordance with some embodiments of the present disclosure.

FIG. 6A illustrates a method 600 for operating an erasing scheme on a capacitor-less 1T memory cell with a BSG for reducing leakage current and improving data retention, in accordance with some embodiments of the present disclosure. The operations of method 600 can be performed in a different order and/or vary, and method 600 can include more operations that are not described for simplicity. FIG. 6B is an operation diagram of erasing a capacitor-less 1T memory cell incorporated with a BSG, according to some embodiments. FIG. 6B is provided as exemplary voltage-over-time operation diagrams to facilitate in the explanation of method 600. The operations provided here are exemplary, and alternative operations in accordance with this disclosure may be performed that are not shown in these figures. Additional operations can be performed in method 600 and are not illustrated in FIGS. 6A and 6B for simplicity.

FIG. 6B illustrates an operation diagram for an erasing scheme on a capacitor-less 1T memory cell, such as memory structure 400 described in FIG. 4G. As discussed with reference to FIG. 2, incorporating BSG in proximity to a lower portion of the pillar can improve data retention and reduce leakage current.

At operation 602, positive voltage biases are applied to the BSG and the plate line of a memory cell, according to some embodiments. In some embodiments, a positive voltage bias applied to the plate line can be between about 0.5 V and about 0.9 V. Using memory structure 400 of FIG. 4G as an example, a positive voltage bias of about 0.8 V can be applied to plate line 108 through plate line contact 476 and vias 462. In some embodiments, a positive voltage bias applied to BSG can be between about 0.9 V and about 1.1 V. Using memory structure 400 of FIG. 4G as an example, a positive voltage bias of about 1 V can be applied to BSG 210 through BSG contact 478 and vias 462.

At operation 604, the positive voltage bias applied to the BSG is decreased and the positive voltage bias applied to the plate line is increased, according to some embodiments. In some embodiments, the decrease and increase in voltage biases to the BSG and the plate line are performed substantially simultaneously. For example, the change in voltage biases can both occur substantially at first time point $T_{11}$. In some embodiments, the BSG and the plate line reach their respective decreased and increased voltage biases at second time point $T_{12}$. In some embodiments, the positive voltage bias to the BSG can be decreased to about 0.7 V and about 0.9 V. Using memory structure 400 of FIG. 4G as an example, a positive voltage bias of about 0.8 V can be applied to BSG 210 through BSG contact 478 and vias 462. In some embodiments, the positive voltage bias to the plate line can be increased to about increased to about 0.9 V and about 1.1 V. Using memory structure 400 of FIG. 4G as an example, a positive voltage bias of about 1.0 V can be applied to plate line 108 through plate line contact 476 and vias 462. In some embodiments, the BSG and the plate line can reach the adjusted positive voltage biases substantially simultaneously at second time point $T_{12}$.

At operation 606, a negative voltage bias is applied to the source line of the memory cell, according to some embodiments. In some embodiments, a negative voltage bias is applied to the source line at a third time point $T_{13}$ that occurred after second time point $T_{12}$. In some embodiments, a negative voltage bias applied to the source line can be between about −1.8 V and about −2.2 V. Using memory structure 400 of FIG. 4G as an example, a negative voltage bias of about −2.0 V can be applied to source line 430 through source line contact 480, vias 462, and conductive line 401. In some embodiments, the source line reaches the applied negative voltage bias at a fourth time point $T_{14}$.

At operation 608, the positive voltage bias applied to the BSG is increased and the positive voltage bias applied to the plate line is decreased, according to some embodiments. In some embodiments, the increase and decrease in voltage biases to the BSG and the plate line are performed substantially simultaneously. For example, the change in voltage biases can both occur substantially at fifth time point $T_{15}$. In some embodiments, the BSG and the plate line reach their respective increased and decreased voltage biases at sixth time point $T_{16}$. In some embodiments, the positive voltage bias to the BSG can be increased to about 0.9 V and about 1.1 V. Using memory structure 400 of FIG. 4G as an example, a positive voltage bias of about 1.0 V can be applied to BSG 210 through BSG contact 478 and vias 462. In some embodiments, the positive voltage bias to the plate line can be decreased to about 0.5 V and about 0.9 V. Using memory structure 400 of FIG. 4G as an example, a positive voltage bias of about 0.8 V can be applied to plate line 108 through plate line contact 476 and vias 462.

At operation 610, a ground voltage is applied to the source line of the memory cell, according to some embodiments. In some embodiments, a ground voltage is applied to the source line at a seventh time point $T_{17}$ that occurred after sixth time point $T_{16}$. Using memory structure 400 of FIG. 4G as an example, the ground voltage can be applied to source line 430 through source line contact 480, vias 462, and conductive line 401.

Figure 7:
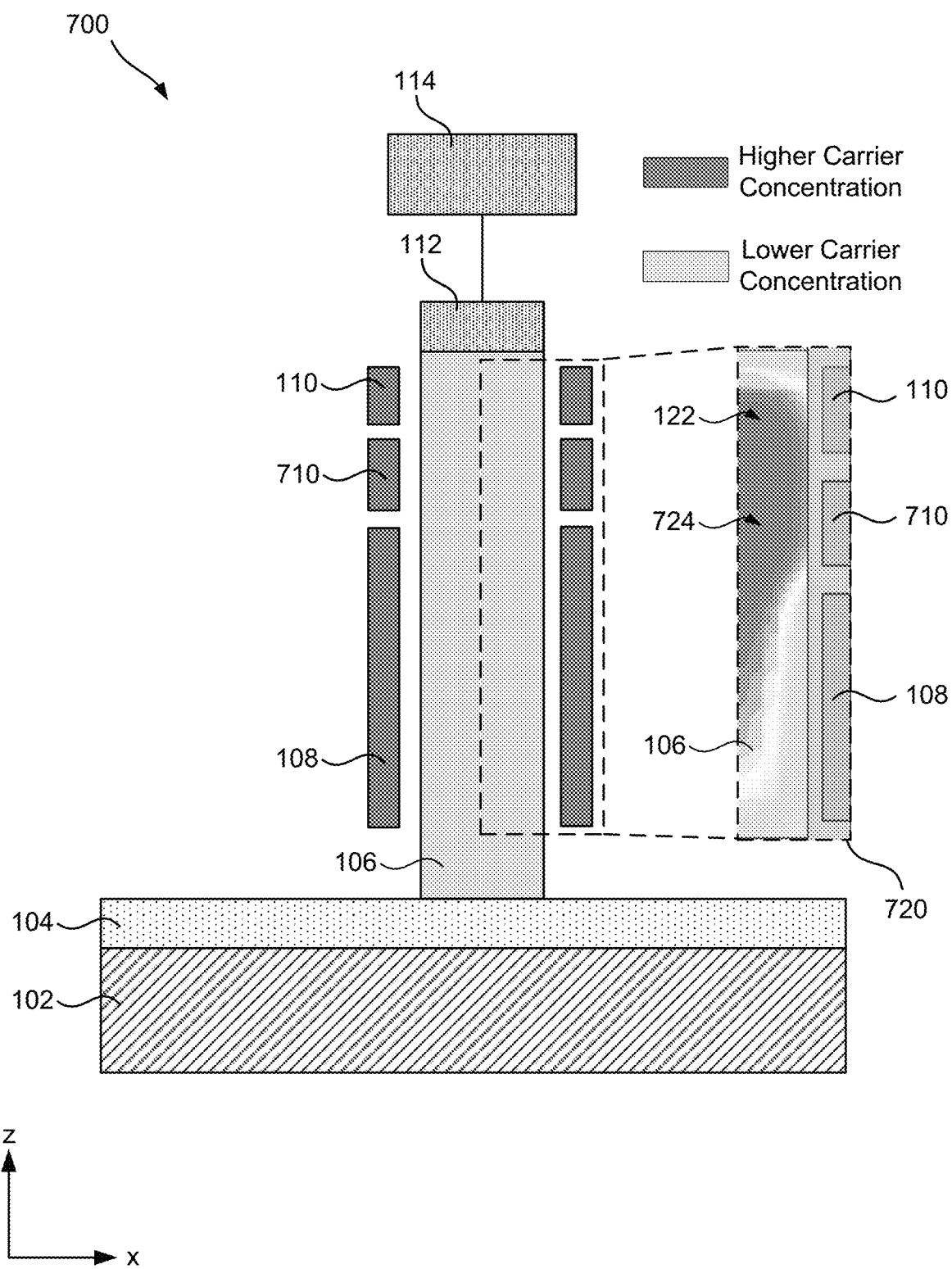
FIG. 7 illustrates a schematic cross-sectional view of an exemplary vertical memory cell incorporating a bias gate, according to some embodiments of the present disclosure.

FIG. 7 illustrates a cross-sectional view of a capacitor-less vertical 1T memory cell 700 with a bias gate for improving programming speed of memory cells and providing the capability of selectively adding electron holes in the pillar. Elements of FIG. 7 that correspond to those in FIG. 2 are designated by similar numeral references.

As shown in FIG. 7, memory cell 700 includes a bias gate such as bias gate 710 formed between plate line 108 and word line 110. In some embodiments, pillar 106 can be formed of a pillar structure and bias gate 710 can be disposed to surround a portion of the sidewall surfaces of pillar 106. In some embodiments, bias gate 710 can be disposed in proximity to an upper portion of pillar 106. In some embodiments, bias gate 710 can be disposed in proximity to the upper half portion of pillar 106. In some embodiments, a dielectric layer can be disposed between bias gate 710 and pillar 106. Bias gate can be formed using a suitable conductive material, such as tungsten, cobalt, copper, aluminum, polysilicon, doped silicon, silicides, and/or combinations thereof. By applying a nominal voltage bias to bias gate 710, a higher charge carrier concentration zone can be formed through collisional ionization, which in turn increases programming speed during a programming scheme. In addition, bias gate 710 can also be used as a top selection gate that can generate additional electron holes through gate-induced drain leakage or impact ionization. Enlarged view 720 illustrates a charge carrier concentration distribution within pillar 106 after a program scheme is performed on memory cell 700. Similar to memory cell described in FIGS. 1A and 2, the majority charge carriers within pillar 106 can be electron holes and a higher charge carrier concentration zone 122 can be formed in an upper portion of pillar 106. Memory cell 700 can be different from memory cell 200 at least because an additional higher charge carrier concentration zone 724 can be formed below higher charge carrier concentration zone 122 by applying a voltage bias to bias gate 710, which in turn improves programming speed. After a program scheme is performed on memory cell 700, the generated holes are non-uniformly distributed within pillar 106. A higher charge carrier concentration zone 122 of holes is located in an upper region of pillar 106 and in proximity to word line 110. Another higher charge carrier concentration zone 724 of holes can also be located in the upper region of pillar 106 and proximate to bias gate 710. In some embodiments, a charge carrier concentration of higher charge carrier concentration zone 724 can be between about $3 \times 10^{15}$ cm$^{-3}$ and about $3 \times 10^{18}$ cm$^{-3}$.

Figure 8:
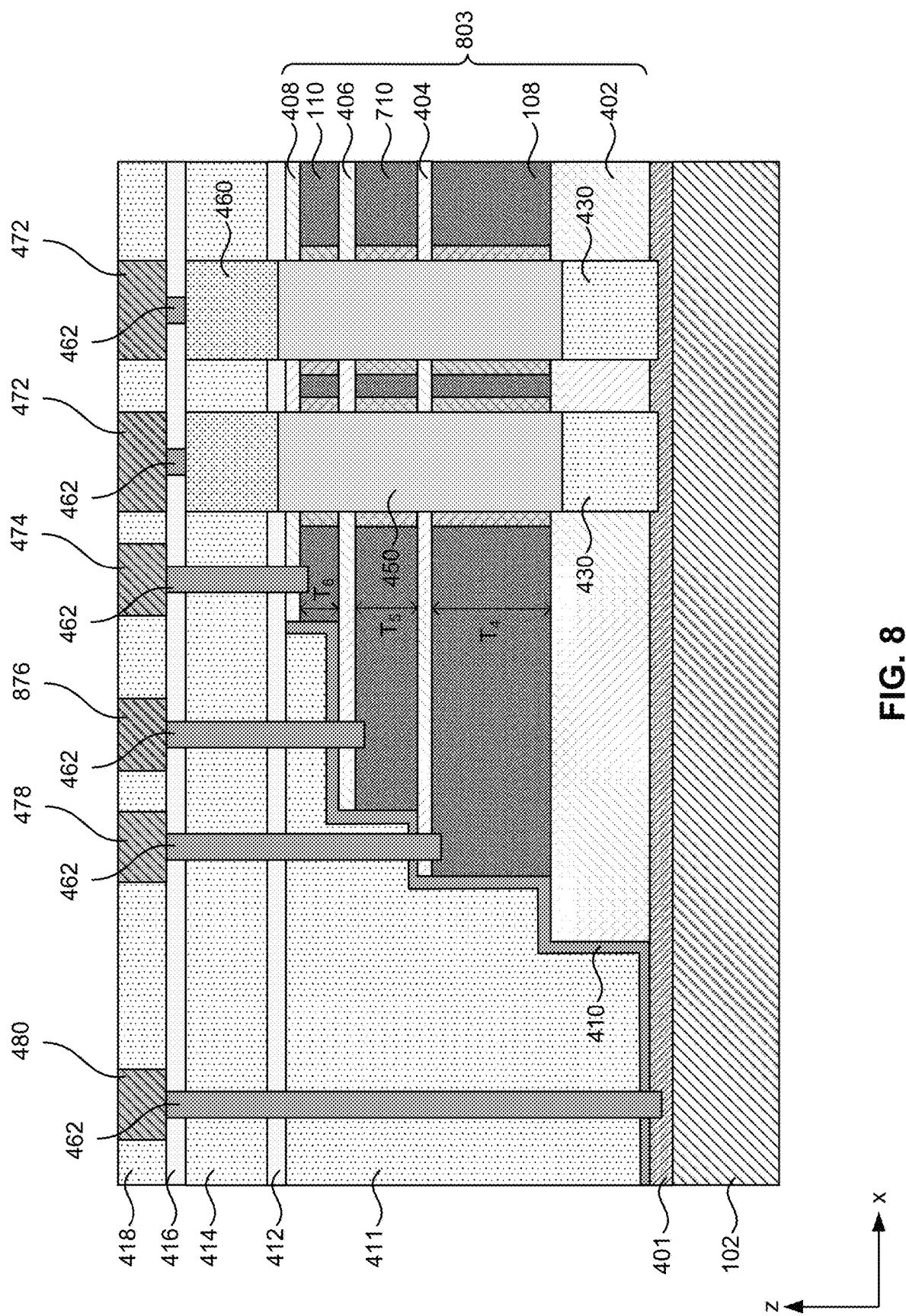
FIG. 8 illustrates a schematic cross-sectional view of an exemplary memory structure incorporating bias gates, according to some embodiments of the present disclosure.

FIG. 8 illustrates a memory structure 800 incorporating a capacitor-less 1T memory cell, such as memory cell 700 described in FIG. 7. Elements of FIG. 8 that correspond to those in FIGS. 4A-4G are designated by similar numeral references. Memory structure 800 can be formed using methods similar to method 300 described in FIG. 3. For example, various fabrication stages of memory structure 800 can be similar to those described with respect to FIGS. 4A-4G and are not described here for simplicity.

A staircase structure 803 can include at least plate line 108, bias gate 710, and word line 110. Each of the aforementioned layers can be formed with a lateral offset with respect to another, such that the lateral offsets form a shape of a staircase to allow an electrical connection to each tier of the layers. In some embodiments, staircase structure 803 can also include dielectric layers 404, 406, and 408 that are respectively formed on plate line 108, bias gate 710, and word line 110. Interconnect structures for electrically coupling to bias gate 710 can include bias gate contact 876 and vias 462. The material composition and formation process of bias gate contact 876 can be similar to those of BSG contact 478 described in FIG. 4G and are not described in detail herein for simplicity.

Bias gate 710 can be formed using a conductive material, such as tungsten, cobalt, copper, aluminum, polysilicon, doped silicon, silicides, and/or combinations thereof. In some embodiments, bias gate 710 can be disposed using CVD, PVD, PECVD, ALD, HDP-CVD, sputtering, and/or any combinations thereof.

Thicknesses of bias gate 710, plate line 108, and word line 110 can affect the charge carrier concentration of a subsequently formed pillar that extends through staircase structure 403. In some embodiments, a thickness $T_4$ of plate line 108 can be between about 60 nm and about 300 nm. In some embodiments, a thickness $T_5$ of bias gate 710 can be between about 15 nm and about 80 nm. In some embodiments, a thickness $T_6$ of word line 110 can be between about 15 nm and about 80 nm. In some embodiments, a ratio of thickness $T_4$ over thickness $T_5$ can be about 4:1. In some embodiments, a ratio of thickness $T_4$ over thickness $T_6$ can be about 4:1.

Figure 9B:
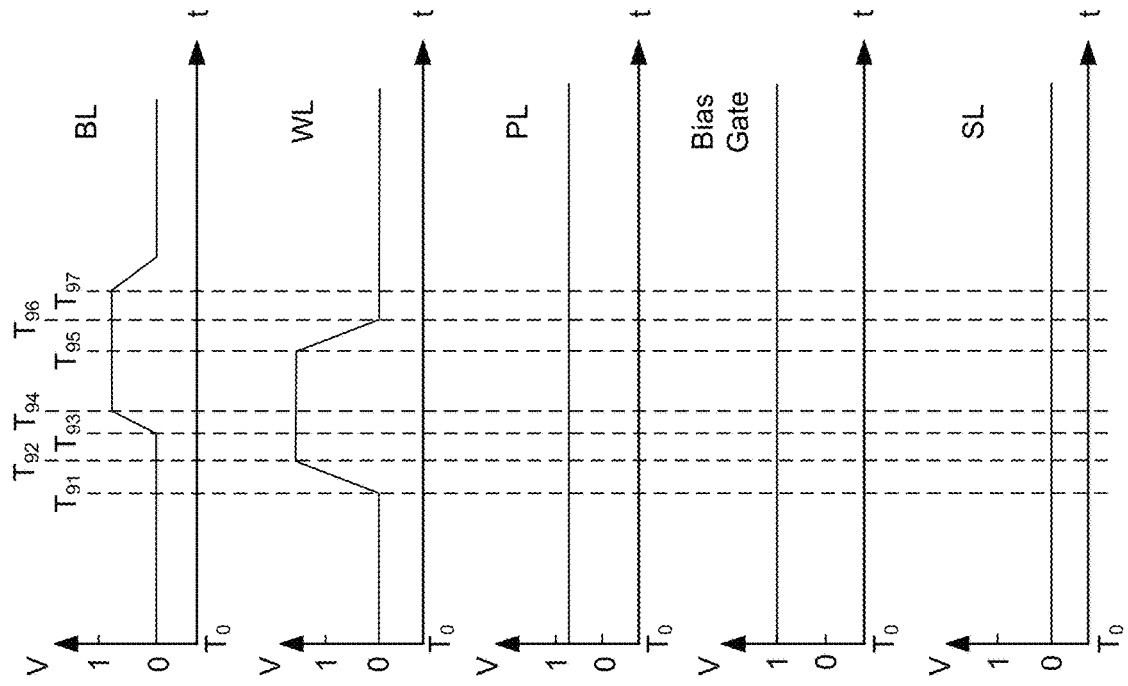
FIG. 9B illustrates an operation diagram of performing a programming scheme on a memory structure having bias gates, in accordance with some embodiments of the present disclosure.
Figure 9A:
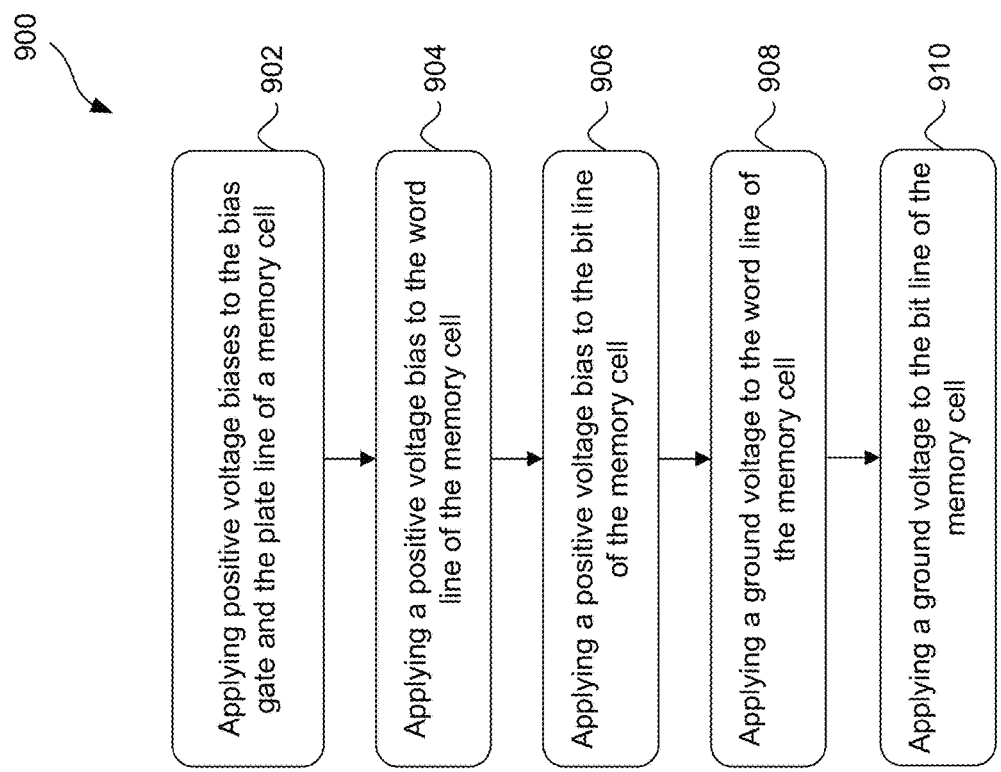
FIG. 9A illustrates a flow diagram of performing a programming scheme on a memory structure having bias gates, in accordance with some embodiments of the present disclosure.

FIG. 9A illustrates a method 900 for operating a programming scheme on a capacitor-less 1T memory cell with a bias gate for improving operation speed such as programming speed, in accordance with some embodiments of the present disclosure. The operations of method 900 can be performed in a different order and/or vary, and method 900 can include more operations that are not described for simplicity. FIG. 9B is an operation diagram of programing a capacitor-less 1T memory cell incorporated with a bias gate, according to some embodiments. FIG. 9B is provided as exemplary voltage-over-time operation diagrams to facilitate in the explanation of method 900. The operations provided here are exemplary, and alternative operations in accordance with this disclosure may be performed that are not shown in these figures. Additional operations can be performed in method 900 and are not illustrated in FIGS. 9A and 9B for simplicity.

FIG. 9B illustrates an operation diagram for a programming scheme on a capacitor-less 1T memory cell, such as memory structure 800 described in FIG. 8. As discussed with reference to FIGS. 7 and 8, incorporating a bias gate in proximity to an upper portion of the pillar can improve operation speed.

At operation 902, positive voltage biases are applied to the bias gate and the plate line of a memory cell, according to some embodiments. In some embodiments, a positive voltage bias applied to the plate line can be between about 0.5 V and about 0.9 V. Using memory structure 800 of FIG. 8 as an example, a positive voltage bias of about 0.8 V can be applied to plate line 108 through plate line contact 476 and vias 462. In some embodiments, a positive voltage bias applied to the bias gate can be between about 0.9 V and about 1.1 V. Using memory structure 800 of FIG. 8 as an example, a positive voltage bias of about 1 V can be applied to bias gate 710 through bias gate contact 876 and vias 462. In some embodiments, the bias gate and the plate line can remain under positive voltage bias during the programming scheme. In some embodiments, the source line is connected to a ground voltage during the programming scheme. The positive voltage biases described herein are examples of voltage bias applied to plate line 108 and bias gate 710. In some embodiments, any suitable positive biases can be used, such as positive voltage bias between about 0.5 V and about 2.0 V. In some embodiments, the source line is connected to a ground voltage during the programming scheme. In some embodiments, a ground voltage can be connected to BSG 210 after the programming scheme is completed. In some embodiments, plate line 108 remains under positive voltage bias after the programming scheme is completed.

At operation 904, a positive voltage bias is applied to the word line of the memory cell, according to some embodiments. In some embodiments, a positive voltage bias is applied to the word line at a first time point $T_{91}$. In some embodiments, a positive voltage bias applied to the word line can be between about 1.3 V and about 1.7 V. Using memory structure 800 of FIG. 8 as an example, a positive voltage bias of about 1.5 V can be applied to word line 110 through word line contact 474 and vias 462. In some embodiments, the word line reaches the applied positive voltage bias at second time point $T_{92}$.

At operation 906, a positive voltage bias is applied to the bit line of the memory cell, according to some embodiments. In some embodiments, a positive voltage bias is applied to the bit line at a third time point $T_{93}$ that occurred after second time point $T_{92}$. In some embodiments, a positive voltage bias applied to the bit line can be between about 0.6 V and about 1 V. Using memory structure 800 of FIG. 8 as an example, a positive voltage bias of about 0.7 V can be applied to bit line 472. In some embodiments, the bit line reaches the applied positive voltage bias at a fourth time point $T_{94}$.

At operation 908, a ground voltage is applied to the word line of the memory cell, according to some embodiments. In some embodiments, a ground voltage is applied to the word line at a fifth time point $T_{95}$ that occurred after fourth time point $T_{94}$. Using memory structure 800 of FIG. 8 as an example, the ground voltage can be applied to word line 110 through word line contact 474 and vias 462. In some embodiments, the word line reaches the ground potential at sixth time point $T_{96}$.

At operation 910, a ground voltage is applied to the bit line of the memory cell, according to some embodiments. In some embodiments, a ground voltage is applied to the bit line at a seventh time point $T_{97}$ that occurred after sixth time point $T_{96}$. Using memory structure 800 of FIG. 8 as an example, the ground voltage can be applied to bit line 472.

Figures 10A, 10B:
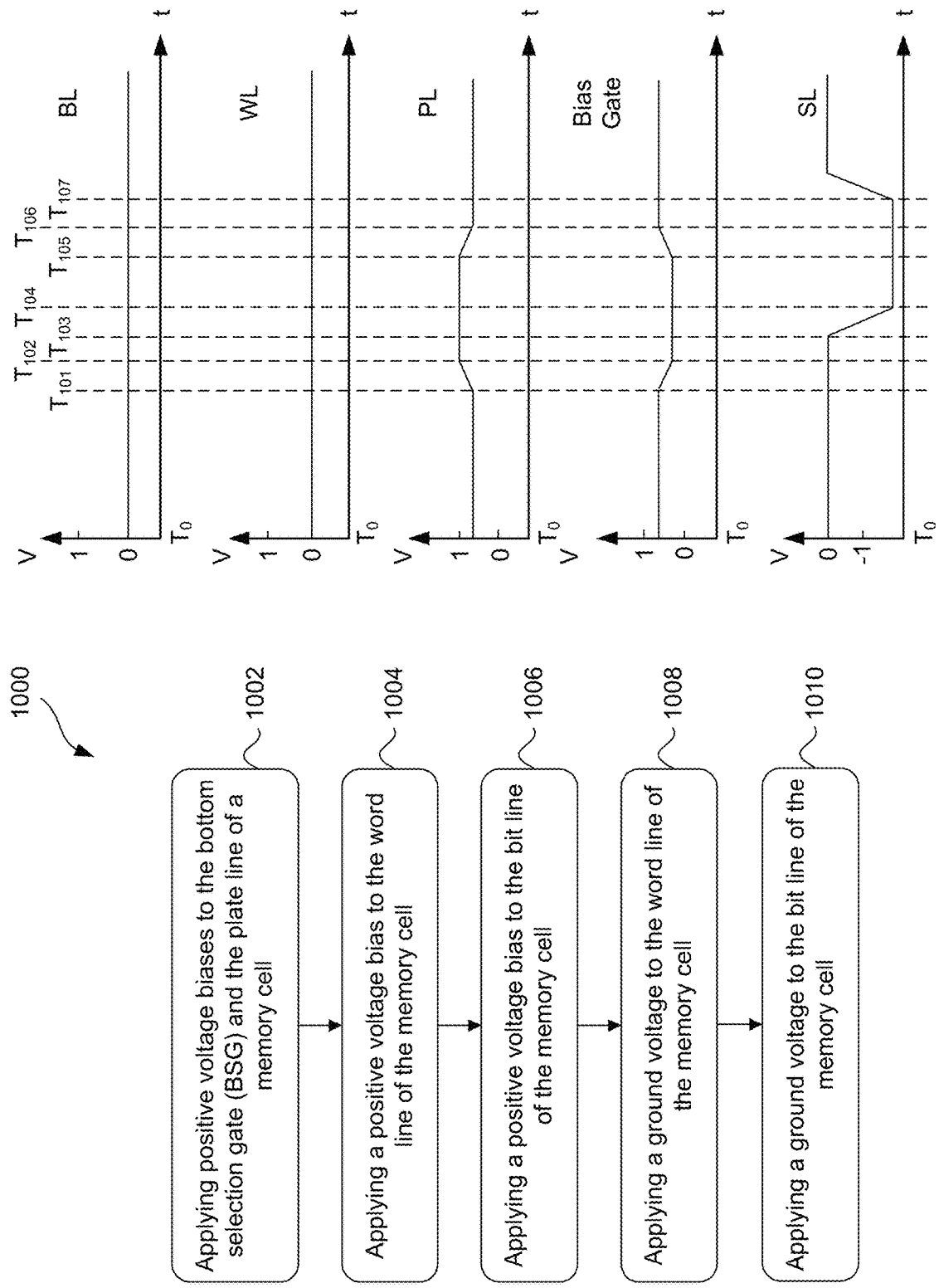
FIG. 10A illustrates a flow diagram of performing an erasing scheme on a memory structure having bias gates, in accordance with some embodiments of the present disclosure.
FIG. 10B illustrates an operation diagram of performing an erasing scheme on a memory structure having bias gates, in accordance with some embodiments of the present disclosure.

FIG. 10A illustrates a method 1000 for operating an erasing scheme on a capacitor-less 1T memory cell with a bias gate for improving operation speed, in accordance with some embodiments of the present disclosure. The operations of method 1000 can be performed in a different order and/or vary, and method 1000 can include more operations that are not described for simplicity. FIG. 10B is an operation diagram of erasing a capacitor-less 1T memory cell incorporated with a bias gate, according to some embodiments. FIG. 10B is provided as exemplary voltage-over-time operation diagrams to facilitate in the explanation of method 1000. The operations provided here are exemplary, and alternative operations in accordance with this disclosure may be performed that are not shown in these figures. Additional operations can be performed in method 1000 and are not illustrated in FIGS. 10A and 10B for simplicity.

FIG. 10B illustrates an operation diagram for an erasing scheme on a capacitor-less 1T memory cell, such as memory structure 800 described in FIG. 8. As discussed with reference to FIGS. 7 and 8, incorporating a bias gate in proximity to an upper portion of the pillar can improve operation speed.

At operation 1002, positive voltage biases are applied to the bias gate and the plate line of a memory cell, according to some embodiments. In some embodiments, a positive voltage bias applied to the plate line can be between about 0.5 V and about 0.9 V. Using memory structure 800 of FIG. 8 as an example, a positive voltage bias of about 0.8 V can be applied to plate line 108 through plate line contact 476 and vias 462. In some embodiments, a positive voltage bias applied to the bias gate can be between about 0.9 V and about 1.1 V. Using memory structure 800 of FIG. 8 as an example, a positive voltage bias of about 1 V can be applied to bias gate 710 through bias contact 876 and vias 462.

At operation 1004, the positive voltage bias applied to the bias gate is decreased and the positive voltage bias applied to the plate line is increased, according to some embodiments. In some embodiments, the decrease and increase in voltage biases to the bias gate and the plate line are performed substantially simultaneously. For example, the change in voltage biases can both occur substantially at first time point $T_{101}$. In some embodiments, the bias gate and the plate line reach their respective decreased and increased voltage biases at second time point $T_{102}$. In some embodiments, the positive voltage bias to the bias gate can be decreased to about 0.7 V and about 0.9 V. Using memory structure 800 of FIG. 8 as an example, a positive voltage bias of about 0.8 V can be applied to bias gate 710 through bias gate contact 876 and vias 462. In some embodiments, the positive voltage bias to the plate line can be increased to about increased to about 0.9 V and about 1.1 V. Using memory structure 800 of FIG. 8 as an example, a positive voltage bias of about 1.0 V can be applied to plate line 108 through plate line contact 476 and vias 462. In some embodiments, the bias gate and the plate line can reach the adjusted positive voltage biases substantially simultaneously at second time point $T_{102}$.

At operation 606, a negative voltage bias is applied to the source line of the memory cell, according to some embodiments. In some embodiments, a negative voltage bias is applied to the source line at a third time point $T_{103}$ that occurred after second time point $T_{102}$. In some embodiments, a negative voltage bias applied to the source line can be between about −1.8 V and about −2.2 V. Using memory structure 800 of FIG. 8 as an example, a negative voltage bias of about −2.0 V can be applied to source line 430 through source line contact 480, vias 462, and conductive line 401. In some embodiments, the source line reaches the applied negative voltage bias at a fourth time point $T_{104}$.

At operation 608, the positive voltage bias applied to the bias gate is increased and the positive voltage bias applied to the plate line is decreased, according to some embodiments. In some embodiments, the increase and decrease in voltage biases to the bias gate and the plate line are performed substantially simultaneously. For example, the change in voltage biases can both occur substantially at fifth time point $T_{105}$. In some embodiments, the bias gate and the plate line reach their respective increased and decreased voltage biases at sixth time point $T_{106}$. In some embodiments, the positive voltage bias to the bias gate can be increased to about 0.9 V and about 1.1 V. Using memory structure 800 of FIG. 8 as an example, a positive voltage bias of about 1.0 V can be applied to bias gate 710 through bias gate contact 876 and vias 462. In some embodiments, the positive voltage bias to the plate line can be decreased to about 0.5 V and about 0.9 V. Using memory structure 800 of FIG. 8 as an example, a positive voltage bias of about 0.8 V can be applied to plate line 108 through plate line contact 476 and vias 462.

At operation 610, a ground voltage is applied to the source line of the memory cell, according to some embodiments. In some embodiments, a ground voltage is applied to the source line at a seventh time point $T_{107}$ that occurred after sixth time point $T_{106}$. Using memory structure 800 of FIG. 8 as an example, the ground voltage can be applied to source line 430 through source line contact 480, vias 462, and conductive line 401.

Various embodiments in accordance with the present disclosure provide structures and fabricating methods for capacitor-less multi-gate vertical 1T memory structures that improves data retention and reduces leakage current. The capacitor-less multi-gate vertical 1T memory structures can include a vertical pillar-shaped pillar surrounded by multiple gates. In some embodiments, the pillar can be surrounded by a top selection gate, a plate line gate, and a bottom selection gate. In some embodiments, the pillar can be surrounded by a word line gate, a bias gate, and a plate line gate. Bit lines can be formed above the pillar. A memory cell is formed at the intersection between a word line and a bit line. The capacitor-less multi-gate vertical 1T memory structures of the present disclosure can provide various benefits, including but not limited to, improved transistor carrier density, improved program/erase speeds, among other things.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for performing a programming operation on a memory device, wherein the memory device comprises a bottom select gate, a plate line above the bottom select gate, a word line above the plate line, a pillar extending through the bottom select gate, a source line under the pillar, and a bit line formed above the pillar, the method comprising:
    applying a first positive voltage bias to the bottom select gate;
    applying a second positive voltage bias to the word line;
    applying a third positive voltage bias to the bit line after the word line reaches the second positive voltage bias;
    applying a ground voltage to the word line; and
    applying the ground voltage to the bit line.

2. The method of claim 1, wherein applying the ground voltage comprises performing the applying to the word line after the bit line reaches the third positive voltage bias.

3. The method of claim 1, wherein applying the ground voltage to the bit line comprises performing the applying after the word line reaches the ground voltage.

4. The method of claim 1, further comprising applying a fourth positive voltage bias to the plate line.

5. The method of claim 1, wherein applying the first positive voltage bias comprises applying a voltage of between about 0.9 V and about 1.1 V to the bottom select gate.

6. A method for performing a programming operation on a memory device, wherein the memory device comprises a plate line, a bias gate above the plate line, a word line above the plate line, a pillar extending through the plate line, a source line under the pillar, a drain cap above the pillar and a bit line formed above the drain cap, the method comprising:

applying a first positive voltage bias to the bias gate;
applying a second positive voltage bias to the word line;
applying a third positive voltage bias to the bit line after the word line reaches the second positive voltage bias;
applying a ground voltage to the word line; and
applying the ground voltage to the bit line.

7. The method of claim 6, wherein applying the ground voltage to the word line occurs after the bit line reaches the third positive voltage bias.

8. The method of claim 6, wherein applying the ground voltage to the bit line occurs after the word line reaches the ground voltage.

9. The method of claim 6, further comprising applying a fourth positive voltage bias to the plate line.

10. The method of claim 6, wherein applying the first positive voltage bias comprises applying a voltage of between about 0.9 V and about 1.1 V to the bias gate.

\* \* \* \* \*